(12) United States Patent
Ahn et al.

(10) Patent No.: US 7,990,060 B2
(45) Date of Patent: Aug. 2, 2011

(54) ORGANIC LIGHT EMITTING DISPLAY DEVICE AND METHOD OF MANUFACTURING THE SAME

(75) Inventors: Byung Chul Ahn, Seoul (KR); Jae Yong Park, Gyeonggi-do (KR); Kyung Man Kim, Gyeonggi-do (KR); Young Mi Kim, Incheon-si (KR); Kang Ju Lee, Gyeonggi-do (KR); Ho Jin Kim, Daegu-si (KR)

(73) Assignee: LG Display Co., Ltd., Seoul (KR)

( * ) Notice: Subject to any disclaimer, the term of this patent is extended or adjusted under 35 U.S.C. 154(b) by 498 days.

(21) Appl. No.: 12/153,421

(22) Filed: May 19, 2008

(65) Prior Publication Data

US 2008/0297042 A1   Dec. 4, 2008

(30) Foreign Application Priority Data

May 31, 2007   (KR) .................. 10-2007-0053108
Jul. 5, 2007   (KR) .................. 10-2007-0067379

(51) Int. Cl.
H01J 1/62   (2006.01)
(52) U.S. Cl. .................. 313/512; 445/25
(58) Field of Classification Search .................. 313/512; 445/25
See application file for complete search history.

(56) References Cited

U.S. PATENT DOCUMENTS

| | | | | |
|---|---|---|---|---|
| 2002/0068143 A1* | 6/2002 | Silvernail et al. | .............. | 428/76 |
| 2002/0093285 A1* | 7/2002 | Sugimoto et al. | ............ | 313/506 |
| 2002/0127431 A1* | 9/2002 | Ueda et al. | .................... | 428/690 |
| 2003/0155861 A1* | 8/2003 | Nishizawa et al. | ........... | 313/512 |
| 2005/0140282 A1* | 6/2005 | Park et al. | .................... | 313/505 |
| 2006/0148366 A1* | 7/2006 | Dings et al. | ..................... | 445/25 |
| 2006/0284556 A1* | 12/2006 | Tremel et al. | ................. | 313/512 |

FOREIGN PATENT DOCUMENTS

| CN | 1189700 A | 8/1998 |
|---|---|---|
| CN | 1638555 A | 7/2005 |

* cited by examiner

*Primary Examiner* — Nimeshkumar D Patel
*Assistant Examiner* — Mary Ellen Bowman
(74) *Attorney, Agent, or Firm* — Morgan, Lewis & Bockius LLP

(57) ABSTRACT

An organic light emitting display device that is capable of preventing the permeation of moisture by changing a sealing structure, thereby preventing the degradation of pixels and thus improving look-and-feel characteristics and a method of manufacturing the same are disclosed. The organic light emitting display device includes a first substrate and a second substrate being opposite to each other, the first substrate and the second substrate having a display region defined in the middle thereof and a non-display region defined at the edge thereof, respectively, a plurality of gate lines and data lines formed at the display region on the first substrate, the gate lines and the data lines crossing each other to define a pixel region, a thin film transistor formed at each of the intersections between the gate lines and data lines, an organic light emitting layer formed on the second substrate corresponding to the pixel region, and first and second electrodes located above and below the organic light emitting layer and a sealing structure connected between the first and second substrates, such that the first and second substrates are bonded to each other by the sealing structure, for preventing the permeation of moisture and gas.

16 Claims, 27 Drawing Sheets display region ← → non-display region display region ←→ non-display region display region ←→ non-display region non-display region ←——→ display region laser or heating non-display region ←——→ display region non-display region ← | → display region non-display region ← | → display region

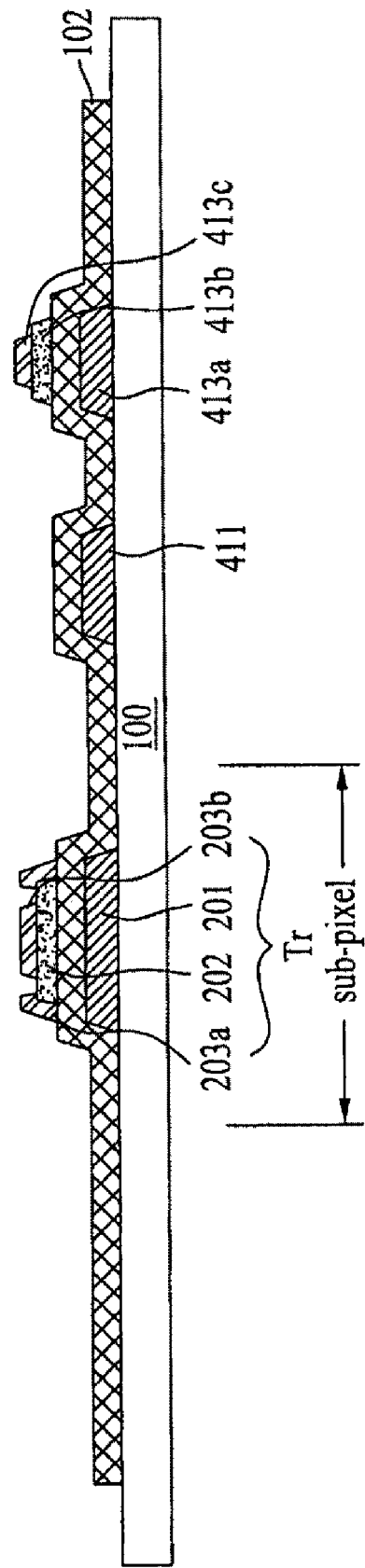

ORGANIC LIGHT EMITTING DISPLAY DEVICE AND METHOD OF MANUFACTURING THE SAME

CROSS-REFERENCE TO RELATED APPLICATION

This application claims the benefit of Korean Patent Application No. P 2007-0053108, filed on May 30, 2007 and No. P 2007-067379, filed on Jul. 5, 2007, which are hereby incorporated by reference in its.

BACKGROUND OF THE INVENTION

1. Field of the Invention

The present invention relates to an organic light emitting display device, and more particularly, to an organic light emitting display device that is capable of preventing the permeation of moisture by changing a sealing structure and a material, thereby preventing the degradation of pixels and thus improving look-and-feel characteristics and a method of manufacturing the same.

2. Discussion of the Related Art

An organic light emitting display device, one of the flat panel displays, is a self-luminous type display device. Consequently, the organic light emitting display device has a higher contrast than a liquid crystal display. Also, the organic light emitting display device does not need a backlight, and therefore, it is possible to reduce the size and weight of the organic light emitting display device. Furthermore, the organic light emitting display device has low power consumption.

In addition, the organic light emitting display device is driven by direct current having low voltage, the response speed of the organic light emitting display device is high, and components of the organic light emitting display device are all solid. Consequently, the organic light emitting display device is strong to external impact, and the organic light emitting display device has a wide temperature range. In particular, it is possible to manufacture the organic light emitting display device at low costs. Furthermore, only deposition and encapsulation equipment is needed to perform a process of manufacturing the organic light emitting display device, unlike when manufacturing a liquid crystal display or a plasma display panel (PDP) Consequently, a process for manufacturing the organic light emitting display device is very simple.

Also, when the organic light emitting display device is driven in an active matrix type structure having a thin film transistor, which is a switching element, for each pixel, the organic light emitting display device exhibits the same brightness although low current is supplied to the organic light emitting display device. Consequently, the organic light emitting display device has advantages in that the power consumption of the organic light emitting display device is low, high resolution of the organic light emitting display device is achieved, and it is possible to greatly increase the size of the organic light emitting display device.

The organic light emitting display device excites a fluorescent material using carriers such as electrons and holes to display video images.

Meanwhile, the organic light emitting display device is principally driven in a passive matrix type structure having no thin film transistor.

However, the passive matrix type structure is under many restrictions relating to resolution, power consumption, and service life. For this reason, research and development have been carried out on an active matrix type organic light emitting display device necessary to manufacture a new-generation display device requiring high resolution and a large-sized screen.

Also, depending upon where a light emitting layer is located on upper and lower substrates, the organic light emitting display device may be classified as a lower light emitting type organic light emitting display device or an upper light emitting type organic light emitting display device. When the upper light emitting type organic light emitting display device is implemented in the active matrix type structure, a thin film transistor array is disposed on the lower substrate, and the light emitting layer is located on the upper substrate, which is called a dual plate type organic light emitting display device (DOD).

Hereinafter, a conventional organic light emitting display device will be described with the accompanying drawings.

FIG. 1 is a sectional view schematically illustrating a sealing structure of a conventional organic light emitting display device, and FIGS. 2A and 2B are photographs respectively illustrating initial normal pixels and pixels degraded by a hygroscopic phenomenon of the conventional organic light emitting display device.

As shown in FIG. 1, conventional organic light emitting display device includes a first substrate 10 having a display region defined in the middle thereof and a non-display region defined at the edge thereof, and a second substrate 20 having a display region defined in the middle thereof and a non-display region defined at the edge thereof, the first substrate 10 and the second substrate 20 being opposite to each other, and a seal pattern 30 formed by bonding the first substrate 10 and the second substrate 20 at the non-display regions between the first substrate 10 and the second substrate 20.

At the display region defined inside the seal pattern 30 are provided a plurality of pixels which emit light according to the principle of an organic light emitting diode.

Also, the seal pattern 30 is cured by irradiating ultraviolet rays to the lower side of the first substrate 10 or the second substrate 20 after bonding the first substrate 10 and the second substrate 20. At this time, the ultraviolet curing seal pattern 30 may be degraded by moisture due to the properties of a material for the seal pattern. For this reason, the improvement to the material for the seal pattern is required. Also, a hygroscopic agent may be applied to the inside of the substrate in order to prevent the permeation of external moisture or gas. In this case, however, the thickness of the device is increased. Furthermore, the use of the hygroscopic agent is limited to fundamentally prevent the permeation of moisture.

The ultraviolet curing seal pattern 30 has the following problems.

Specifically, the seal pattern 30 is an organic material curable by ultraviolet (UV) rays. Due to the properties of the organic material, moisture may easily permeate through the seal pattern 30, and the seal pattern 30 may be easily separated from the surface of the first substrate 10 or the second substrate 20. Consequently, when the seal pattern 30 is separated from the surface of the first substrate 10 or the second substrate 20, or when moisture ($H_2O$), carbon dioxide ($CO_2$) or hydrogen ($H_2$) permeates through the seal pattern 30, pixels located in the display region inside the seal pattern 30 are gradually degraded from the edge toward the middle thereof, with the result that the pixels are deformed from the normal shapes of FIG. 2A to the abnormal shapes of FIG. 2B, and therefore, the regions that can be driven as the normal pixel regions shrink. Also, the hygroscopic phenomenon becomes more serious with the passage of time, and the shrinkage phenomenon of the respective pixels located inside the seal pattern 30 becomes more serious. As a result, the service life of the organic light emitting display device under the hygroscopic phenomenon decreases.

The above-described conventional organic light emitting display device has the following problems.

The conventional seal pattern, used to seal between the opposite first and second substrates, is an ultraviolet curing type organic seal pattern. The seal pattern is cured by irradiating ultraviolet rays to the lower side of the first substrate or the second substrate. The ultraviolet curing type organic seal pattern has problems in that moisture or the like may easily permeate into the seal pattern according to external environment, and the seal pattern may be easily separated from the substrates, which are made of glass, whereby external gases are introduced into the display region to degrade the organic light emitting layer from the edge of the organic light emitting layer, with the result that the size of the pixels decreases. There are many restrictions in solving such degradation problem, and therefore, there is a high necessity to improve a material for the seal pattern.

SUMMARY OF THE INVENTION

Accordingly, the present invention is directed to an organic light emitting display device and a method of manufacturing the same that substantially obviate one or more problems due to limitations and disadvantages of the related art.

An object of the present invention is to provide an organic light emitting display device that is capable of preventing the permeation of moisture through the change of a sealing structure and a material, thereby preventing the degradation of pixels and thus improving look-and-feel characteristics and a method of manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device includes a first substrate and a second substrate being opposite to each other, the first substrate and the second substrate having a display region defined in the middle thereof and a non-display region defined at the edge thereof, respectively, a plurality of gate lines and data lines formed at the display region on the first substrate, the gate lines and the data lines crossing each other to define a pixel region, a thin film transistor formed at each of the intersections between the gate lines and data lines, an organic light emitting layer formed on the second substrate corresponding to the pixel region, and first and second electrodes located above and below the organic light emitting layer and a sealing structure connected between the first and second substrates, such that the first and second substrates are bonded to each other by the sealing structure, for preventing the permeation of moisture and gas.

Preferably, the sealing structure includes a seal line formed at a position corresponding to the non-display regions between the first substrate and the second substrate and a capsule film formed to surround front, rear, and side surfaces of the first and second substrates.

The sealing structure may include metal members, having a low melting point, formed at the non-display regions between the first substrate and the second substrate and a connection electrode pattern for interconnecting the metal members. Also, the sealing structure may further include a pair of metal patterns formed at the opposite non-display regions on the first substrate and the second substrate, the metal patterns being joined to each other, and an organic filler formed below one of the metal pattern for adjusting the height of the corresponding metal pattern. In the sealing structure, an ultraviolet curing seal pattern may be also formed at the non-display regions between the first substrate and the second substrate.

In another aspect of the present invention, a method of manufacturing an organic light emitting display device includes preparing a first substrate having a display region defined in the middle thereof and a non-display region defined at the edge thereof, and a second substrate having a display region defined in the middle thereof and a non-display region defined at the edge thereof, the first substrate and the second substrate being opposite to each other, forming a plurality of gate lines and data lines formed at the display region on the first substrate, the gate lines and data lines intersecting one another to define a pixel region, forming a thin film transistor formed at each of the intersections between the gate lines and data lines, forming an organic light emitting layer formed on the second substrate corresponding to the pixel region, and first and second electrodes located above and below the organic light emitting layer, and forming a sealing structure between the first and second substrates, at least at the side thereof, such that the first and second substrates are bonded to each other by the sealing structure, and, at the same time, the permeation of moisture and the introduction of gas are prevented by the sealing structure.

Preferably, the step of forming the sealing structure includes forming a seal line on the first substrate or the second substrate and bonding the first substrate and the second substrate to each other, and forming a capsule film for surrounding front, rear, and side surfaces of the bonded first and second substrates.

Preferably, the step of forming the capsule film is carried out by digging, dispensing, printing, or spin coating the bonded first and second substrates.

The step of forming the sealing structure may include forming a transparent electrode at the pixel region on the first substrate and a first metal oxide film at the non-display region on the first substrate in the shape of a closed loop, forming a first electrode at the display region on the second substrate and a second metal oxide film at the non-display region on the second substrate in a shape corresponding to the first metal oxide film, forming an organic light emitting layer on the first electrode of the second substrate corresponding to the pixel region and a second electrode on the organic light emitting layer, forming a connection electrode pattern on the first metal oxide film, and joining the connection electrode pattern and the second metal oxide film to each other while arranging the first and second substrates such that the first and second substrates are opposite to each other. At this time, the step of joining the connection electrode pattern and the second metal oxide film to each other is carried out by irradiating laser to the rear surface of the first substrate or the second substrate or by applying heat at a temperature of 100 to 300° C. using a hot plate.

Alternatively, the step of forming the sealing structure may include forming organic partition walls formed on the first electrodes corresponding to the gate lines and the data lines, and forming an organic filler at the non-display region of the second substrate corresponding to the first electrode pattern, forming an organic light emitting layer on the second substrate corresponding to the pixel region on each organic partition wall, forming a second electrode pattern on the organic light emitting layer for covering the second electrode and the organic filler, and joining the first and second electrode patterns to each other while arranging the first and second substrates such that the first and second substrates are opposite to each other. At this time, the step of joining the first and second electrode patterns to each other is carried out by applying heat to the first substrate including the first electrode pattern using a hot plate or by irradiating laser to the rear surface of the first or second substrate at the non-display region thereof.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 19A to 19E are sectional views illustrating a process for manufacturing an organic light emitting display device according to a sixth embodiment of the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

An organic light emitting display device according to the present invention is characterized in that components constituting a seal pattern is improved, or a capsule film is formed, to prevent the degradation of pixels (image quality) in consideration of a fact that a seal pattern including a general ultraviolet curing type organic components is weak to moisture in the air or gases.

Figure 1:
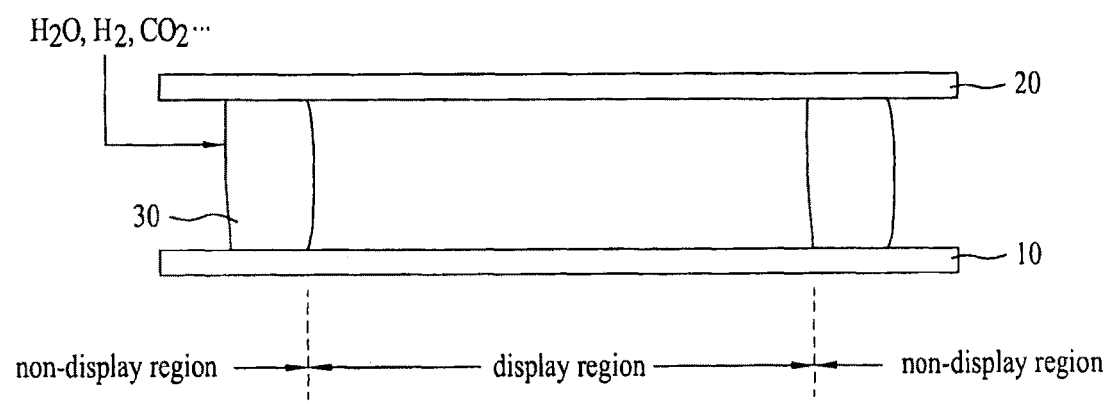
FIG. 1 is a sectional view schematically illustrating a sealing structure of a conventional organic light emitting display device.
Figure 2A:
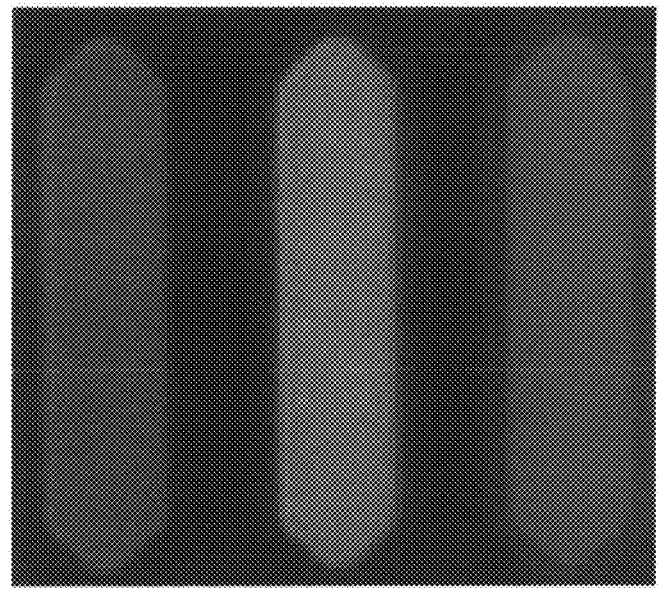
FIGS. 2A and 2B are photographs respectively illustrating initial normal pixels and pixels degraded by a hygroscopic phenomenon of the conventional organic light emitting display device.
Figure 2B:
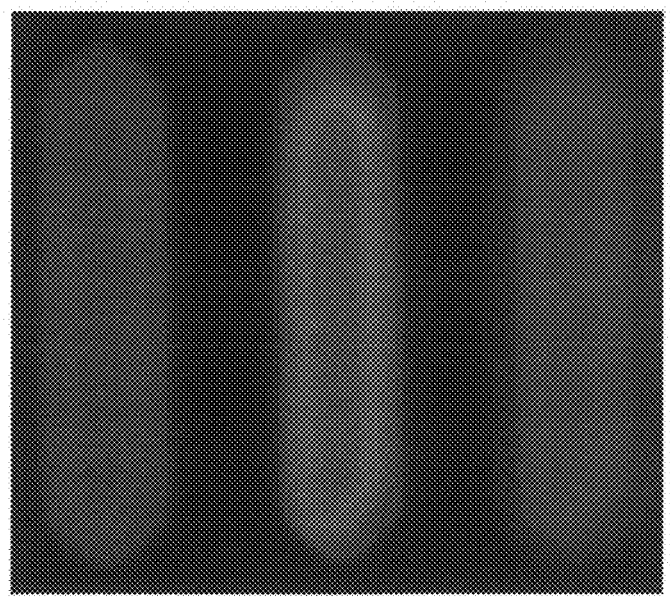
Figure 3:
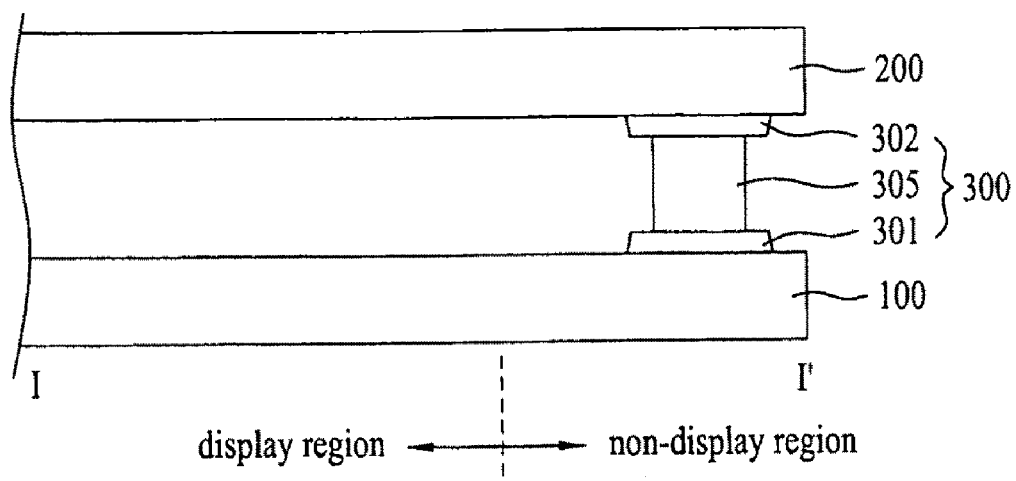
FIG. 3 is a sectional view illustrating a sealing structure of an organic light emitting display device according to a first embodiment of the present invention.
Figure 4:
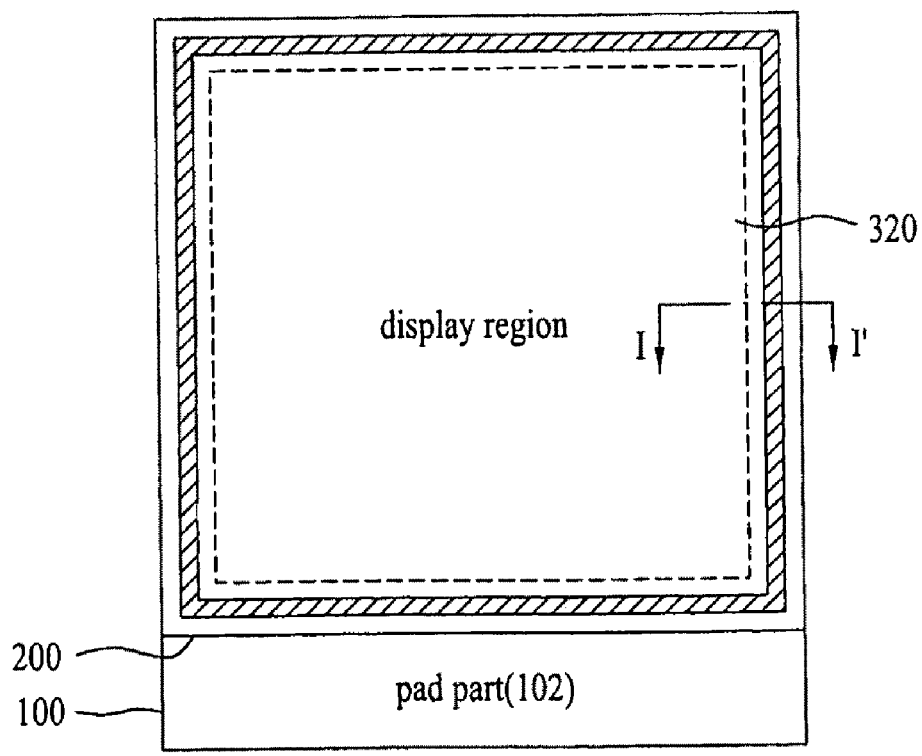
FIG. 4 is a plan view schematically illustrating the organic light emitting display device of FIG. 3.

FIG. 3 is a sectional view illustrating a sealing structure of an organic light emitting display device according to a first embodiment of the present invention, and FIG. 4 is a plan view schematically illustrating the organic light emitting display device of FIG. 3.

As shown in FIGS. 3 and 4, the sealing structure of the organic light emitting display device according to the first embodiment of the present invention includes a first substrate 100 having a display region (within a dotted-line region of FIG. 4) defined in the middle thereof and a non-display region defined at the edge thereof, a second substrate 200 having a display region defined in the middle thereof and a non-display region defined at the edge thereof, the first substrate 100 and the second substrate 200 being opposite to each other, and a seal unit 300 formed between first substrate 100 and the second substrate 200 at positions corresponding to the non-display regions.

The seal unit 300 includes a first metal oxide film 301 formed on the first substrate 100, a second metal oxide film 302 formed on the second substrate 200, the first metal oxide film 301 and the second metal oxide film 302 being opposite to each other, and a connection electrode pattern 305 formed between the first metal oxide film 301 and the second metal oxide film 302 for electrically interconnecting the first metal oxide film 301 and the second metal oxide film 302.

The first metal oxide film 301, the second metal oxide film 302, and the connection electrode pattern 305 between the first metal oxide film 301 and the second metal oxide film 302 are constructed in a stacked structure. Consequently, the adhesion between the first metal oxide film 301 and the second metal oxide film 302 is improved, and therefore, moisture or other impurities are prevented from being introduced into pixel parts inside the display regions, with the result that the degradation of the pixel parts at the display regions is prevented, the reliability of devices formed at the display regions is improved, and a service life of the display is increased.

Here, a low melting point metal material (In, Sn, Zn, Pb, or the like) or a low melting point metal alloy (PbSn, InSn, or the like) may be used as metal constituting the connection electrode pattern 305. Consequently, it is possible to achieve the joining between the first metal oxide film 301 and the second metal oxide film 302 by thermal inter-diffusion even at low temperature of the connection electrode pattern 305 while the first metal oxide film 301 and the second metal oxide film 302 are joined via the connection electrode pattern 305, and therefore, the first metal oxide film 301 and the second metal oxide film 302 are not affected by temperature. Here, the melting point of the metal pattern 305 to achieve the joining between the first metal oxide film 301 and the second metal oxide film 302 is 100 to 300° C. In this case, the adhesion between the first metal oxide film 301 and the connection electrode pattern 305 and the adhesion between the second metal oxide film 302 and the connection electrode pattern 305 are increased by thermal treatment or laser irradiation, and therefore, moisture ($H_2O$) is prevented from being introduced between the first metal oxide film 301 and the connection electrode pattern 305 and between the second metal oxide film 302 and the connection electrode pattern 305. That is, the sealing unit 300 serves to isolate the interiors of the display regions from the outside, thereby improving the reliability of devices formed at the display regions and increasing a service life of the display.

During the thermal treatment or the laser irradiation, it is required for the first and second substrates 100 and 200 or other components not to become abnormal. Also, the first metal oxide film 301 may be formed by patterning the same layer as a transparent electrode of the first substrate 100 where a thin film transistor (TFT) array is formed, and the second metal oxide film 302 may be formed by patterning a first electrode or a second electrode of the second substrate 200 where an organic light emitting layer is formed. In this case, processes for forming the first metal oxide film 301 and the second metal oxide film 302 are not needed, and therefore, the overall process is simplified. In this case, the first metal oxide film 301 and the second metal oxide film 302 are transparent electrodes made of indium tin oxide (ITO) or indium zinc oxide (IZO). At this time, the second metal oxide film 302 and the first electrode (not shown) may be integrated at the same layer. According to circumstances, the first metal oxide film 301 and the second metal oxide film 302 may be made of oxides of low melting point metal materials (In, Sn, Zn, Pb, etc.), which are the materials for the metal pattern 305, in addition to the transparent electrodes made of indium tin oxide (ITO). In this case, the first metal oxide film 301 and the second metal oxide film 302 may be formed separately through processes different from processes for forming the TFT array including the transparent electrodes or the first and second electrodes located above and below the organic light emitting layer.

As previously described, the seal unit 300 is constructed in a stacked structure of the first metal oxide film 301, connection electrode pattern 305, and the second metal oxide film 302. The first metal oxide film 301 and the second metal oxide film 302 are formed through the deposition and patterning on the first and second substrates 100 and 200, respectively, and the first metal oxide film 301 and the second metal oxide film 302 are joined to each other via the connection electrode pattern 305 by the thermal inter-diffusion.

Here, the joining between the first metal oxide film 301 and the connection electrode pattern 305 and the joining between the second metal oxide film 302 and the connection electrode pattern 305 are achieved by irradiating laser to the lower-side rear surface of the first substrate 100 or the upper-side rear surface of the second substrate 200 to weld the connection electrode pattern 305. Alternatively, the joining between the first metal oxide film 301 and the connection electrode pattern 305 and the joining between the second metal oxide film 302 and the connection electrode pattern 305 may be achieved by thermally treating the first substrate 100 or the second substrate 200 at a temperature at which the connection electrode pattern 305 is partially weldable, for example at a temperature of 100 to 300° C. At this time, the connection electrode pattern 305 is partially melted at the temperature of 100 to 300° C., because the connection electrode pattern 305 is made of the low melting point metal material, and therefore, the connection electrode pattern 305 is joined to the first metal oxide film 301 and the second metal oxide film 302. The reason why the connection electrode pattern 305 is made of the low melting point metal material is that it is required for the organic light emitting layer located on the second substrate 200 to be prevented becoming abnormal by the temperature, when the connection electrode pattern 305 is melted, while the first and second metal oxide film 301 and 302 and the connection electrode pattern 305 are joined.

Meanwhile, an unexplained pad part 102 of FIG. 4 is a region of the first substrate 100, which is larger by the pad part 102 than the second substrate 200. On the pad part 102 is formed a chip including a driver IC for applying signals to the TFT array formed on the first substrate 100. That is, the pad part 102 generates and applies signals to a gate line and a data line formed at the first substrate 100. Also, the pad part 102 generates and applies a ground power supply voltage signal to a first electrode of an organic light emitting diode including a light emitting layer on the display region and first and second electrodes located above and below the light emitting layer.

FIG. 3 is a sectional view taken along line I-I' of FIG. 4. Consequently, FIG. 3 illustrates only one side of the seal unit 300. In practice, the seal unit 300 is formed between the first and second substrates 100 and 200 in the shape of a closed loop.

Figure 5A:
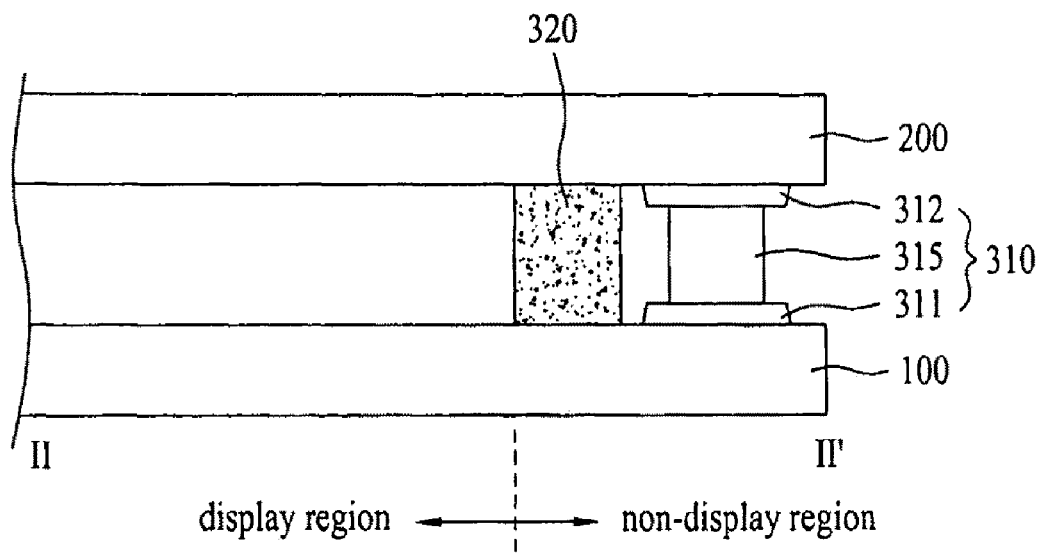
FIGS. 5A and 5B are sectional views respectively illustrating sealing structures of an organic light emitting display device according to a second embodiment of the present invention and a modification thereof.
Figure 5B:
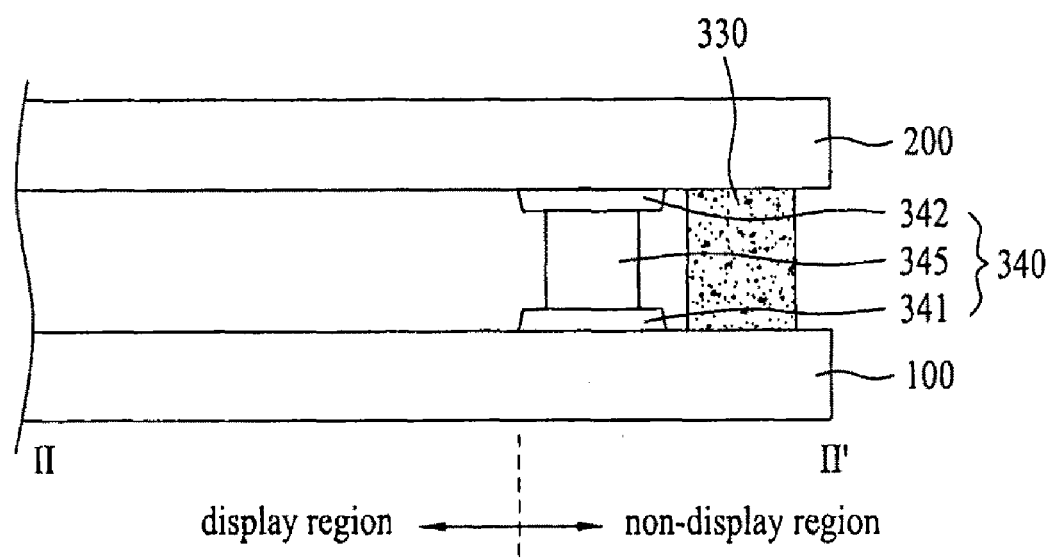
Figure 6:
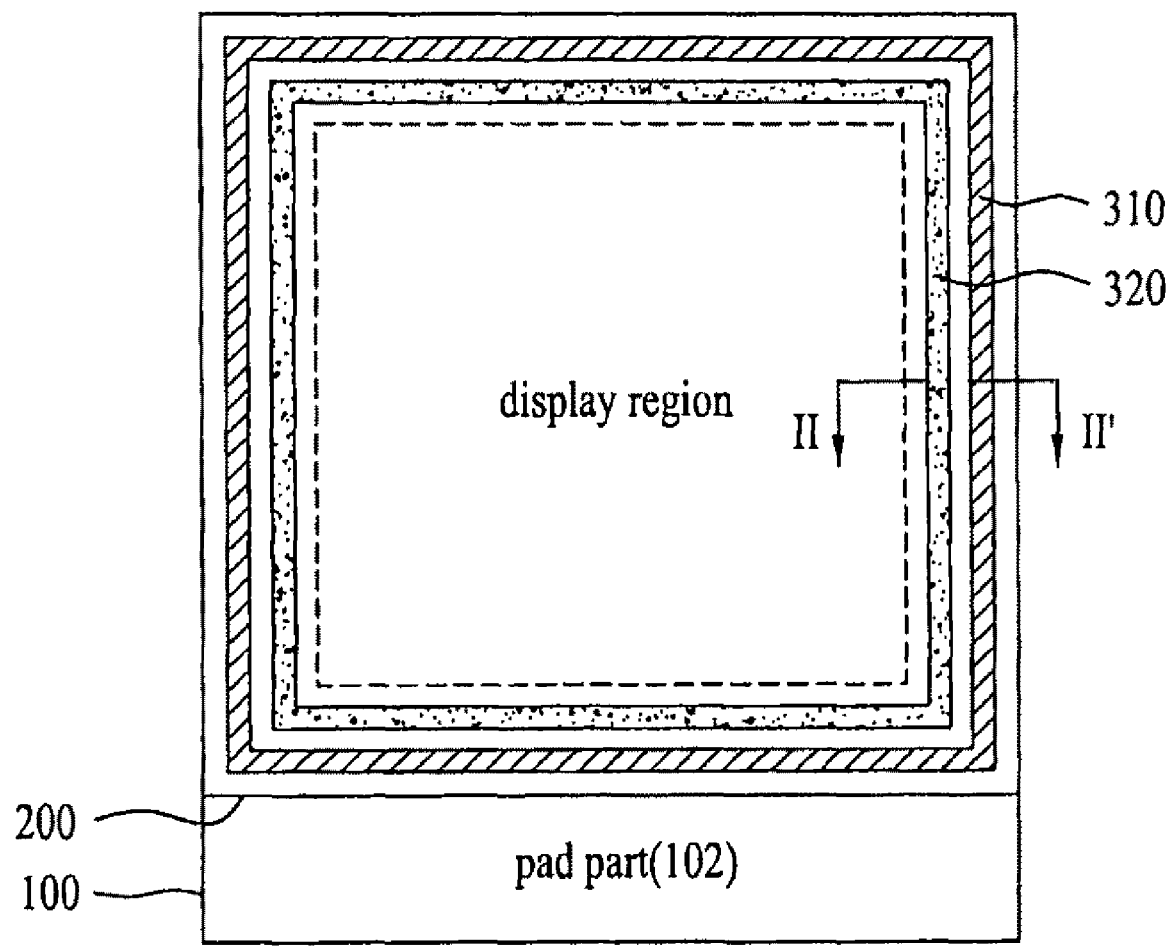
FIG. 6 is a plan view illustrating the organic light emitting display device of FIGS. 5A and 5B.

FIGS. 5A and 5B are sectional views respectively illustrating sealing structures of an organic light emitting display device according to a second embodiment of the present invention and a modification thereof, and FIG. 6 is a plan view illustrating the organic light emitting display device of FIGS. 5A and 5B.

As shown in FIGS. 5A and 6, the organic light emitting display device according to the second embodiment of the present invention is similar in structure to the organic light emitting display device according to the first embodiment of the present invention in that a seal unit 310 includes first and second metal oxide films 311 and 312 and a connection electrode pattern 315 for interconnecting the first and second metal oxide films 311 and 312. However, the organic light emitting display device according to the second embodiment of the present invention is different in structure from the organic light emitting display device according to the first embodiment of the present invention in that the organic light emitting display device according to the second embodiment of the present invention further includes a seal pattern 320 made of an ultraviolet curing type organic material.

Here, the seal pattern 320 may be formed at the non-display region on the first substrate 100 where a TFT array (not shown) is formed or at the non-display region on the second substrate 200 where an organic light emitting layer (not shown) is formed and first and second electrodes (not shown) are formed above and below the organic light emitting layer. Preferably, the seal pattern 320 is formed on the second substrate 200, which has no steps.

In the second embodiment, the seal unit 310 and the seal pattern 320 are formed in the shape of a rectangular closed loop surrounding the edge of a display region (within a dotted-line region), as in the previous first embodiment. That is, the seal pattern 320 is formed in the seal unit 310 including metal components in the shape of a frame. The seal unit 310 is formed in the shape of a frame larger than that of the seal pattern 320 and spaced a predetermined distance from that of the seal pattern 320. In this case, the joining between the first and second metal oxide films 311 and 312 and the connection electrode pattern 315 is achieved through thermal diffusion by heat treatment or laser irradiation. The seal pattern 320 is cured by irradiating laser to the lower side rear surface of the first substrate 100 or the upper side rear surface of the second substrate 200.

Here, the joining between the metal components constituting the seal unit 310 and the curing of the seal pattern 320 may be carried out irrespective of order.

Alternatively, as shown in FIG. 5B, the positional relationship between a seal unit 340 and a seal pattern 330 may be changed according to circumstances. That is, the seal pattern 330 may be formed in the shape of a larger frame, and the seal unit 340, constituted by the metal components, may be formed in the shape of a smaller frame disposed inside the large frame of the seal pattern 330. In any cases, the seal pattern 330 and the seal unit 340 are formed at positions corresponding to non-display regions.

In this case, when a connection electrode pattern 345 is joined to first and second metal oxide films 341 and 342 and a connection electrode pattern 345 while the connection electrode pattern 345 is melted, the adhesion between the first and second metal oxide films 341 and 342 and the connection electrode pattern 345 is increased, although the seal pattern 330, made of the organic material, tends to be easily separated from the first and second substrates 100 and 200. As a result, the seal pattern 330 is prevented from being separated from the surfaces of the first and second substrates 100 and 200. Consequently, the introduction of moisture or other impurities into the display regions is prevented by the seal unit 340, made of the metal material, located between the first and second substrates 100 and 200, whereby the degradation of pixels at the display regions is prevented.

Figure 7A:
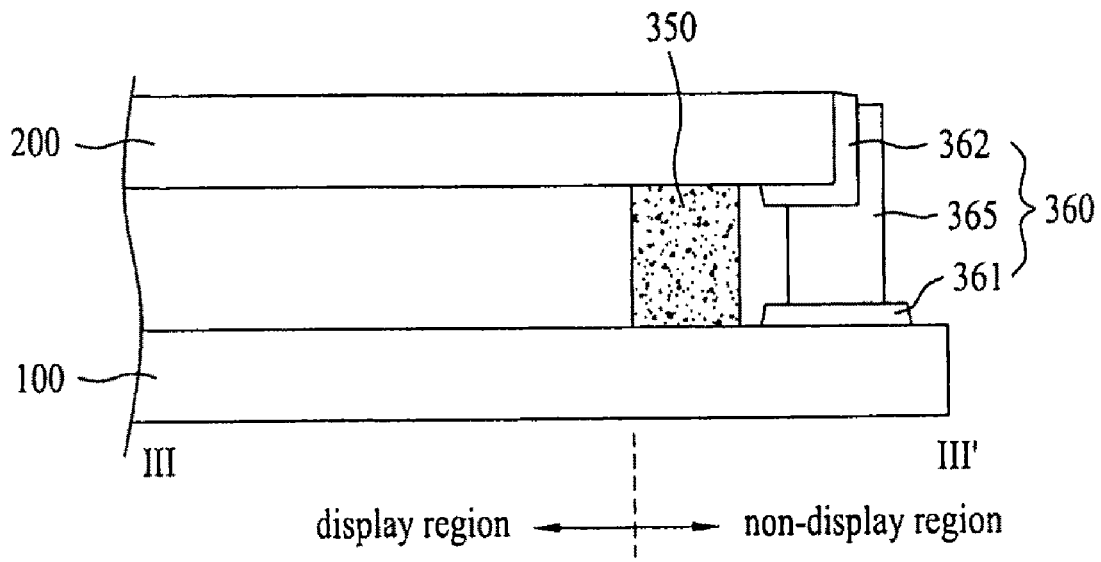
FIGS. 7A and 7B are sectional views illustrating sealing structures of an organic light emitting display device according to a third embodiment of the present invention.
Figure 7B:
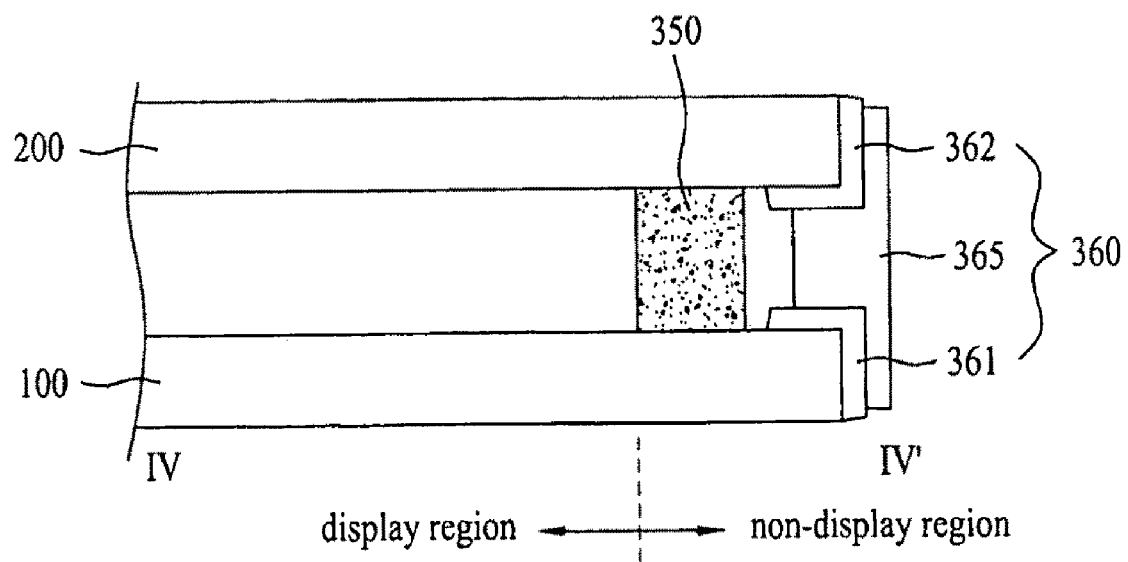
Figure 8:
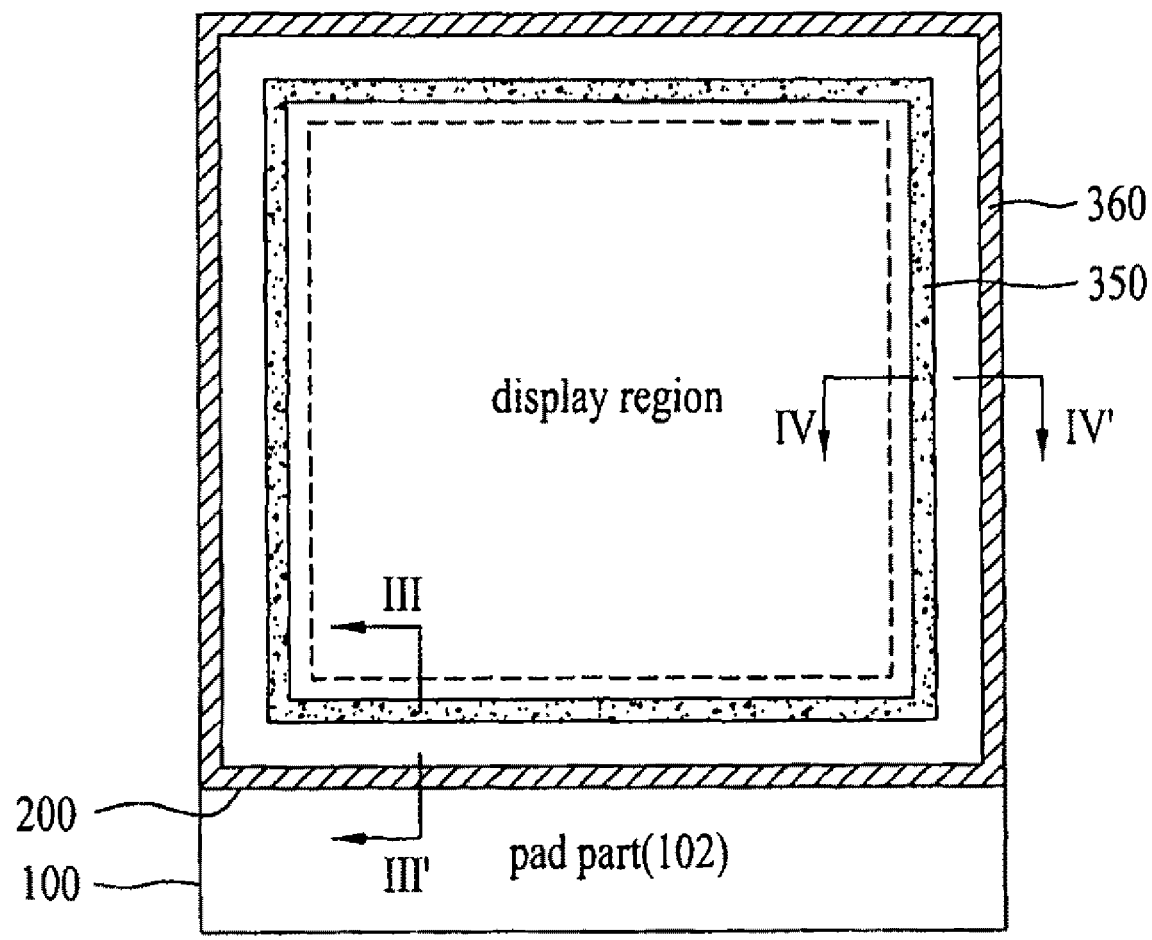
FIG. 8 is a plan view illustrating the organic light emitting display device including areas corresponding to FIGS. 7A and 7B.

FIGS. 7A and 7B are sectional views illustrating sealing structures of an organic light emitting display device according to a third embodiment of the present invention, and FIG. 8 is a plan view illustrating the organic light emitting display device including areas corresponding to FIGS. 7A and 7B.

As shown in FIG. 8, the organic light emitting display device according to the third embodiment of the present invention includes a seal pattern 350 made of an ultraviolet curing type organic material and a seal unit 360 made of a metal compound. The seal pattern 350 and the seal unit 360 are located at a non-display region.

Here, the seal pattern 350 is formed in the shape of a frame surrounding the edge of a display region. The seal unit 360 is formed in the shape of a frame spaced a predetermined distance from the seal pattern 350 such that the frame of the seal unit 360 is located outside the frame of the seal pattern 350 along the edge of the second substrate 200.

Here, the seal unit 360 includes a first metal oxide film 361 formed on the first substrate 100, a second metal oxide film 362 formed on the second substrate 200, and a connection electrode pattern 365 for electrically interconnecting the first metal oxide film 361 and the second metal oxide film 362. Here, the first and second metal oxide films 361 and 362 are formed at the edge of the second substrate 200. Consequently, as shown in FIGS. 7A and 7B, the first and second metal oxide films 361 and 362 correspond to the top and the side of the respective substrates, respectively. However, as shown in FIG. 7A, a pad part 102 is a region of the first substrate 100, which is larger by the pad part 102 than the second substrate 200. The first metal oxide film 361 adjacent to the pad part 102 does not extend to the side of the first substrate 100 but is formed only on the top of the first substrate 100 (on the non-display region excluding the pad part).

The formation of the first and second metal oxide films 361 and 362 may be carried out by a plasma spraying method. The connection electrode pattern 365 may be formed by melting and spraying paste including a low melting point metal material, having a melting point of 100 to 300° C., such as indium (In) between the first and second substrates 100 and 200 at positions corresponding to the edges of the first and second substrates 100 and 200 on which the first and second metal oxide films 361 and 362 are formed, respectively. After the molten paste is sprayed, the other components of the paste, excluding the low melting point metal material, are removed by volatilization at a heating process for forming the connection electrode pattern 365.

According to circumstances, all of the first and second metal oxide films 361 and 362 and the connection electrode pattern 365 may be formed on the first and second substrates 100 and 200, which are attached to each other, by a spraying method or an electroplating method, after the preceding formation of the seal pattern 350.

FIG. 8 illustrates the ultraviolet curing type seal pattern 350 formed inside the seal unit 360. According to circumstances, however, the seal pattern 350 may be omitted, and only the seal unit 360, which includes the first and second metal oxide films 361 and 362 and the connection electrode pattern 365, may be provided.

A process for forming the ultraviolet curing type seal pattern 350 is the same as the previously described process.

Also, a process for forming the first and second metal oxide films 361 and 362 and the connection electrode pattern 365 is the same as the process described in connection with the previous first to third embodiments, excluding the positional relationship between the first and second metal oxide films 361 and 362 and the connection electrode pattern 365.

Hereinafter, a concrete sealing method of the organic light emitting display device according to the present invention will be described.

Figure 9:
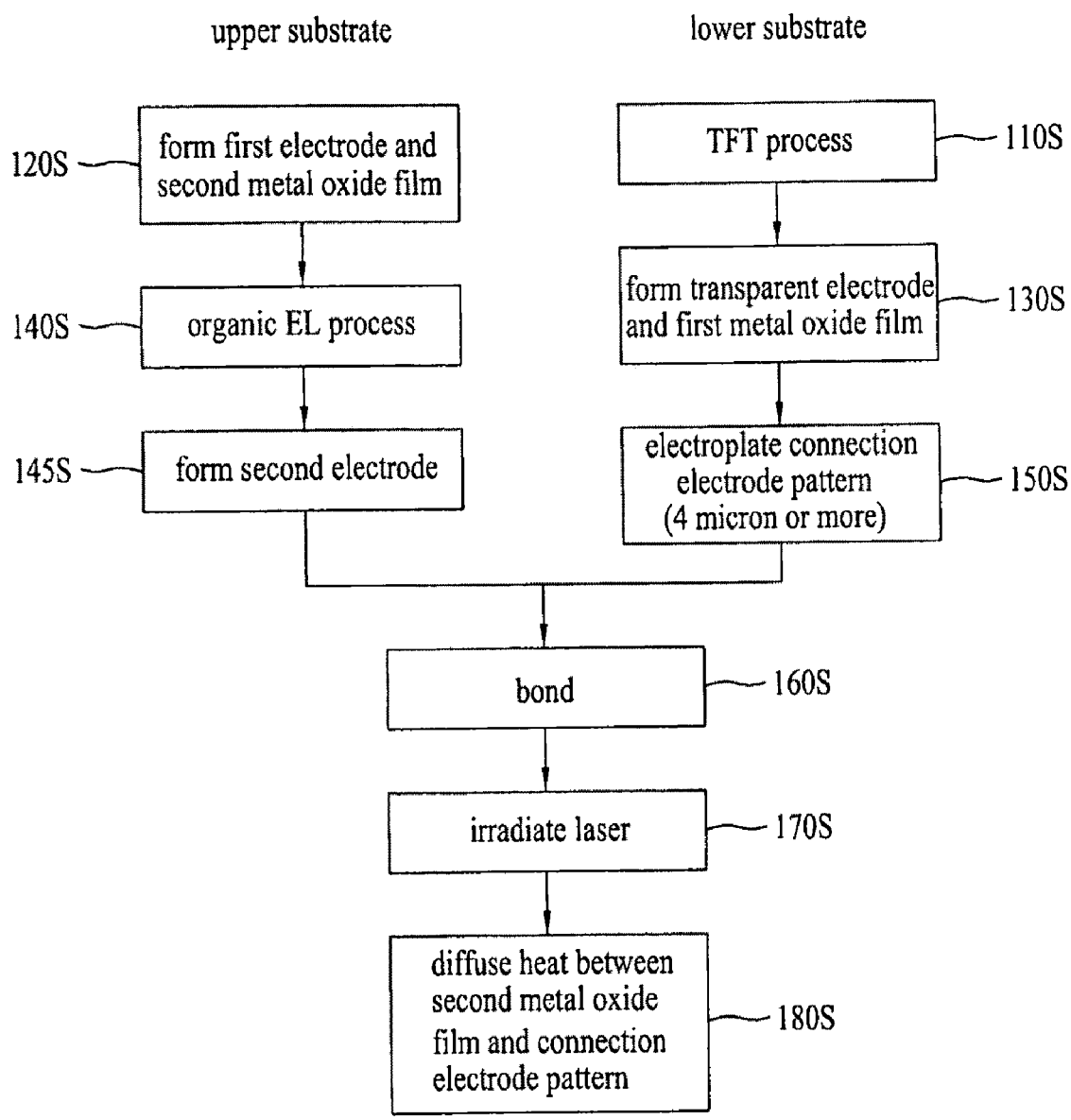
FIG. 9 is a flow chart illustrating a sealing method of the organic light emitting display device according to the first embodiment of the present invention.
Figure 11:
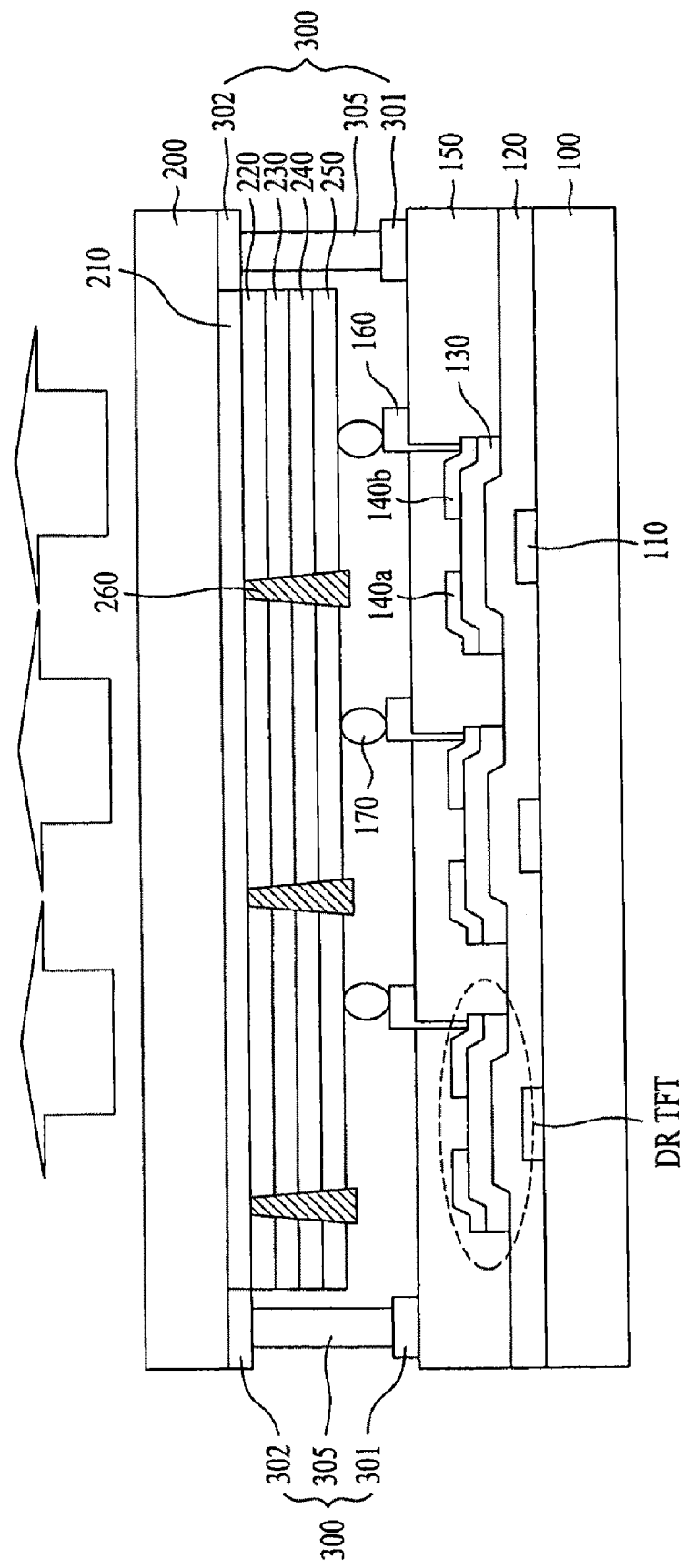
FIG. 11 is a sectional view concretely illustrating the internal construction of the organic light emitting display device according to the first embodiment of the present invention.

FIG. 9 is a flow chart illustrating a sealing method of the organic light emitting display device according to the first embodiment of the present invention, and FIG. 11 is a sectional view concretely illustrating the internal construction of the organic light emitting display device according to the first embodiment of the present invention.

As shown in FIGS. 9 and 11, the organic light emitting display device according to the first embodiment of the present invention is manufactured as follows.

First, a TFT array is formed on a first substrate 100 (110S). A process for forming the TFT array is carried out as follows.

On the first substrate 100 (the lower substrate) is formed a gate line (the same layer as a gate electrode 110) in one direction. Also, the gate electrode 110 is formed on the first substrate 100 such that the gate electrode 110 protrudes from the gate line to respective pixel regions. Subsequently, a gate insulation film 120 is formed on the entire surface of the first substrate 100 including the gate line and the gate electrode 110. On the gate insulation film 120 is formed a semiconductor layer 130 such that the semiconductor layer 130 is located above the gate electrode 110 to cover the gate electrode 110. Subsequently, source/drain electrodes 140a and 140b are formed at opposite sides of the semiconductor layer 130. Also, a data line (not shown) is formed such that the data line intersects the gate line to define a pixel region. Subsequently, a protective film 150 is formed on the gate insulation film 120 including the source/drain electrodes 140a and 140b. Subsequently, the protective film 150 is selectively removed to form a contact hole which partially exposes the drain electrode 140b.

Meanwhile, the thin film transistor, including the gate electrode 110, the semiconductor layer 130, and the source/drain electrodes 140a and 140b shown in FIG. 11, serves as a driver thin film transistor (DR TFT) in which electric current flows according to the operation of an organic light emitting diode (a structure including an organic light emitting layer in the organic light emitting display device and first and second electrodes above and below the organic light emitting layer).

Subsequently, a transparent electrode layer is formed on the entire surface of the protective film 150 including the contact hole, and the transparent electrode layer is selectively removed to form a transparent electrode 160 at each pixel region and form a first metal oxide film 301 at the non-display region.

Subsequently, a conductive spacer 170 is formed at a predetermined area on the transparent electrode 160. This is provided to achieve current conduction between the transparent electrode 160 and a second electrode formed on the second substrate 200, the second electrode being opposite to the transparent electrode 160.

A process is carried out on the second substrate 200, opposite to the first substrate 100, in the following sequence.

That is, a transparent conductive metal material, such as indium tin oxide (ITO), is deposited on the entire surface of the second substrate 200 having a plurality of pixel regions P arranged in a matrix pattern to form a first electrode 210, as in the first substrate 100, to which the second substrate 200 is opposite. During the formation of the first electrode 210, a second metal oxide film 302 is formed on the second substrate 200 such that the second metal oxide film 302 corresponds to the first metal oxide film 301 formed in the shape of a closed loop (120S).

As shown in the drawing, the first electrode 210 and the second metal oxide film 302 may be formed in an integral structure. Alternatively, the first electrode 210 may be formed at the display region, and the second metal oxide film 302 may be formed at the non-display region.

Subsequently, a metal material having high electrical conductivity, such as copper, is deposited on the entire surface of the second substrate 200, including the first electrode 210, and then the deposited metal material is patterned by photolithography and etching to form a bus line (not shown) on the first electrode 210. At this time, the bus line is formed on the first electrode 210 excluding the pixel regions P. The bus line is constructed generally in the shape of a lattice. The bus line is a component formed to reduce resistance of the first electrode 210. According to circumstances, the bus line may be omitted. In the drawing, the bus line is not illustrated.

Subsequently, organic partition walls 260, made of an organic material, such as polyimide, and having a predetermined height are formed on the second substrate 200 corresponding to the gate line and the data line (above the bus line at the time of forming the bus line), Subsequently, a first carrier transmission layer 220, an organic light emitting layer 230, and a second carrier transmission layer 240 are sequentially formed on the first electrode 210 located at each pixel region between the respective organic partition walls 260 using an evaporation equipment (140S). The organic light emitting layer 230 has any one selected from a group consisting of red (R), green (G), and blue (B). The first and second carrier transmission layers 220 and 240 serve to inject and transmit hole and electron to the organic light emitting layer 230 between the first electrode 210 and a second electrode 250, which will be formed subsequently.

Subsequently, a metal layer, made of a metal material such as titanium (Ti), molybdenum (Mo), calcium (Ca), magnesium (Mg), barium (Ba), or aluminum (Al), is deposited on the entire surface of the second substrate 200, including the second carrier transmission layers 240 and the organic partition walls 260, to form second electrodes 250 (145S). At this time, the second electrodes 250 are separated from each other between the respective pixel regions P. That is, the second electrodes 250 are separated from each other by the respective partition walls 260. According to circumstances, the second electrodes 250 may be left on the respective partition walls 260. In this case, the electrode patterns are formed on the second electrodes 250 and the partition walls 260 in separated patterns by the step and spacing between the partition walls 260 and the second carrier transmission layers 240, whereby it is possible to selectively drive the organic light emitting diodes for each pixel region.

After the first and second substrates 10 and 200, having the TFT arrays and the organic light emitting layers formed thereon, are prepared as described above, a low melting point metal material, such as indium (In), is electroplated on the first metal oxide film 301 of the first substrate 100 or the second metal oxide film 302 of the second substrate 200 to form an electrode pattern (connection electrode pattern) 305 having a predetermined height (height equivalent to the gap between the first and second substrates 100 and 200) (150S). Preferably, the electrode pattern 305 has a height of approximately 4 μM to 10 μm.

Subsequently, the first and second substrates 100 and 200 are attached to each other while the first and second substrates 100 and 200 are disposed opposite to each other (160S).

Subsequently, laser is irradiated to the area where the electrode pattern 305 is formed (170S), such that thermal interdiffusion occurs between the electrode pattern 305 and the first and second metal oxide films 301 and 302, and therefore, the joint between the electrode pattern 305 and the first and second metal oxide films 301 and 302 is achieved (180S). As a result, a seal unit 300 is formed by the joint between the first and second metal oxide films 301 and 302 and the electrode pattern 305.

The above-described manufacturing method may be applied to the second embodiment previously described with the reference to FIGS. 5A, 5B, and 6, with the exception of that a process for forming a seal pattern 320 or 330, made of an ultraviolet curing type organic material, such that the seal pattern 320 or 330 is spaced apart from the seal unit 310 or 340 at the non-display region on the second substrate 200, is further included, and an ultraviolet curing process therefore is also further included.

Hereinafter, a method of manufacturing an organic light emitting display device according to a third embodiment of the present invention will be described with reference to FIGS. 7A, 7B, and 10.

Figure 10:
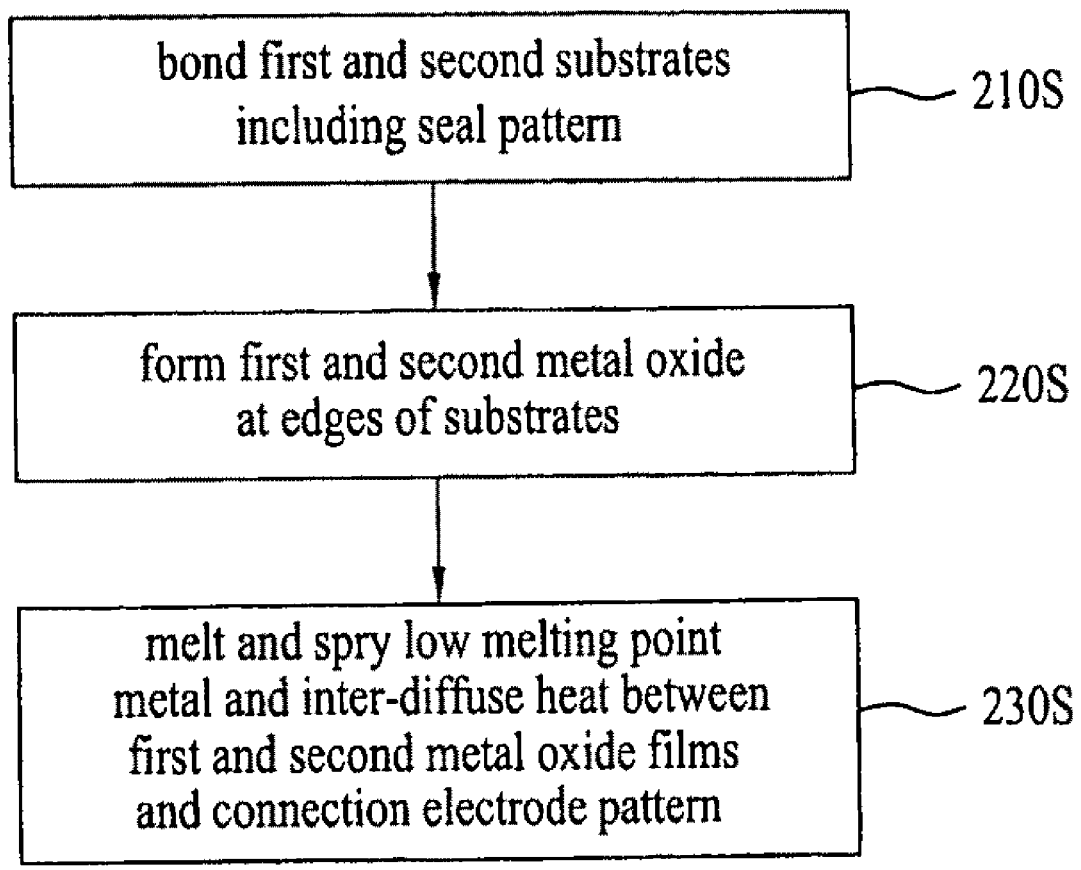
FIG. 10 is flow chart illustrating a sealing method of the organic light emitting display device according to the third embodiment of the present invention.

FIG. 10 is flow chart illustrating a sealing method of the organic light emitting display device according to the third embodiment of the present invention.

As shown in FIG. 10, the organic light emitting display device according to the third embodiment of the present invention is manufactured by forming a thin film transistor array, including a thin film transistor, on a first substrate 100 and forming first and second electrodes 210 and 250 (see FIG. 11) and an organic light emitting layer 230 on a second substrate 200. The process carried out on the first and second substrates 100 and 200 is identical to the process carried out by Step 110S to 145S, excluding the formation of the first and second metal oxide films 301 and 302, of the process previously described with reference to FIG. 9.

Subsequently, a seal pattern 350 (see FIGS. 7A and 7B) is formed in the shape of a closed loop at a non-display region on the first substrate 100 or the second substrate 200, and the first and second substrates 100 and 200 are attached to each other (210S).

Subsequently, plasma is sprayed to the first and second substrates 100 and 200 outside the area where the seal pattern 350 is formed to form first and second metal oxide films 361 and 362. Here, the first and second metal oxide films 361 and 362 are located at positions corresponding to each other. In consideration of that the first substrate 100 is larger than the second substrate 200, the first and second metal oxide films 361 and 362 are formed between the first and second substrates 100 and 200 at positions corresponding to the edge of the second substrate 200. In this case, the second metal oxide film 362 is formed at the top and side of the edge of the second substrate 200, and the first metal oxide film 361 is formed at the top and side of the edge corresponding to other three sides excluding the side adjacent to the pad part 102. The first metal oxide film 361 is formed at the top of the first substrate 100 corresponding to the interface between the pad part 102 and the second substrate 200 at the side adjacent to the pad part 102.

Subsequently, the seal pattern 350 between the first and second substrates 100 and 200 is cured by irradiating ultraviolet rays to the rear surface of the first substrate 100 or the rear surface of the second substrate 200. According to circumstances, the curing of the seal pattern 350 by the ultraviolet rays may be carried out before the formation of the first and second metal oxide films 361 and 362.

Subsequently, a low melting point metal material is melted and sprayed between the edges of the attached first and second substrates 100 and 200. The low melting point metal material constitutes a connection electrode pattern 365 for interconnecting the first and second metal oxide films 361 and 362 by laser irradiation or thermal treatment. As a result, a seal unit 360, including the first and second metal oxide films 361 and 362 and the connection electrode pattern 365, is formed.

Hereinafter, an embodiment in which the seal unit is formed by adding an additional structure in addition to the electrode components will be described.

Figure 12:
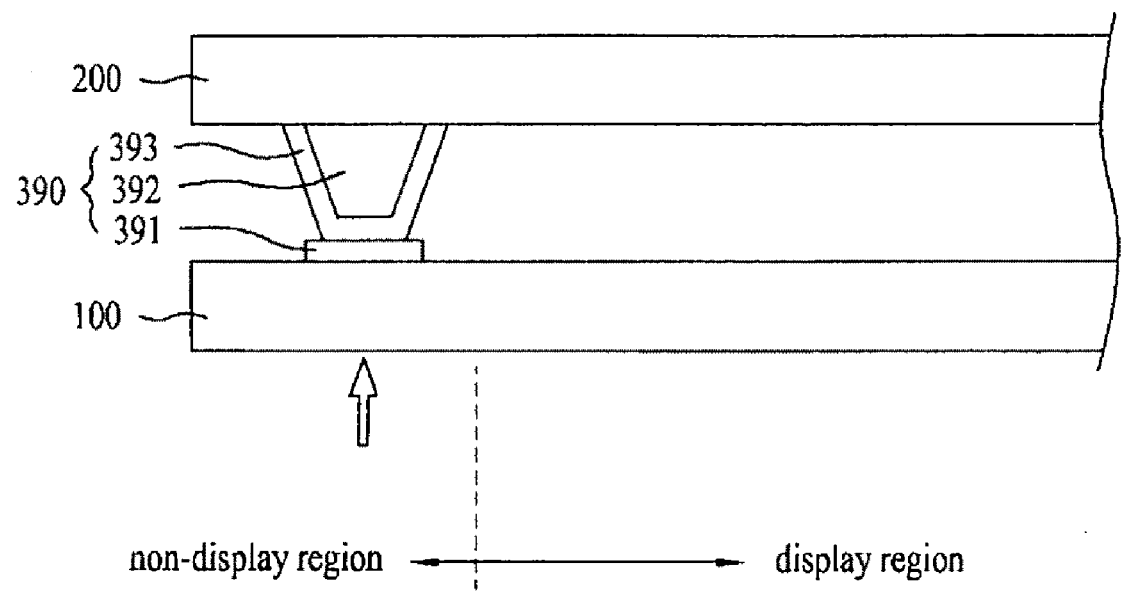
FIG. 12 is a sectional view illustrating a sealing structure of an organic light emitting display device according to a fourth embodiment of the present invention.

FIG. 12 is a sectional view illustrating a sealing structure of an organic light emitting display device according to a fourth embodiment of the present invention.

As shown in FIG. 12, the organic light emitting display device according to the fourth embodiment of the present invention includes a first substrate 100 having a display region (within a dotted-line region of FIG. 4) defined in the middle thereof and a non-display region defined at the edge thereof, a second substrate 200 having a display region defined in the middle thereof and a non-display region defined at the edge thereof, the first substrate 100 and the second substrate 200 being opposite to each other, and a seal unit 390 formed between first substrate 100 and the second substrate 200 at positions corresponding to the non-display regions.

The seal unit 390 includes a first electrode pattern 391 formed on the first substrate 100, an organic filler 392 formed on the second substrate 200 such that the organic filler 392 is opposite to the first electrode pattern 391, and a second electrode pattern 393 covering the organic filler 392 such that the second electrode pattern 393 is in contact with the first electrode pattern 391.

For the simplification of a process, the first electrode pattern 391 may be formed at the same layer as a transparent electrode formed on the first substrate 100, and the second electrode pattern 393 may be formed at the same layer as a first electrode formed on the second substrate 200. The organic filler 392 may be formed at the same layer as organic partition walls formed at the area where organic light emitting layers formed at the respective pixel regions are divided.

The first electrode pattern 391 and the second electrode pattern 393 of the seal unit 390 are joined to the first and second substrates 100 and 200 by laser irradiation or thermal treatment. That is, the seal unit 390 is a structure in which the joint between the seal unit 390 and the first and second substrates 100 and 200 is achieved by thermal inter-diffusion between the metal materials. Consequently, the seal unit 390 exhibits high adhesion and does not allow external gases, such as $H_2O$, $H_2$, $CO_2$, etc., to be transmitted therethrough, whereby moisture is prevented from being introduced into the display regions.

The seal unit 390 of the organic light emitting display device according to the fourth embodiment of the present invention is formed in the shape of a frame having no gap between the first and second substrates 100 and 200 as shown in FIG. 4.

Here, the joining between first electrode pattern 391 and the second electrode pattern 393 is achieved by irradiating laser to the lower side of the first substrate 100 or the upper side of the second substrate 200 or welding at least one of the first and second connection electrode patterns 391 and 393 though heat treatment.

Now, the sealing method of the organic light emitting display device with the above-stated construction according to the fourth embodiment of the present invention will be described in more detail.

Figure 13A:
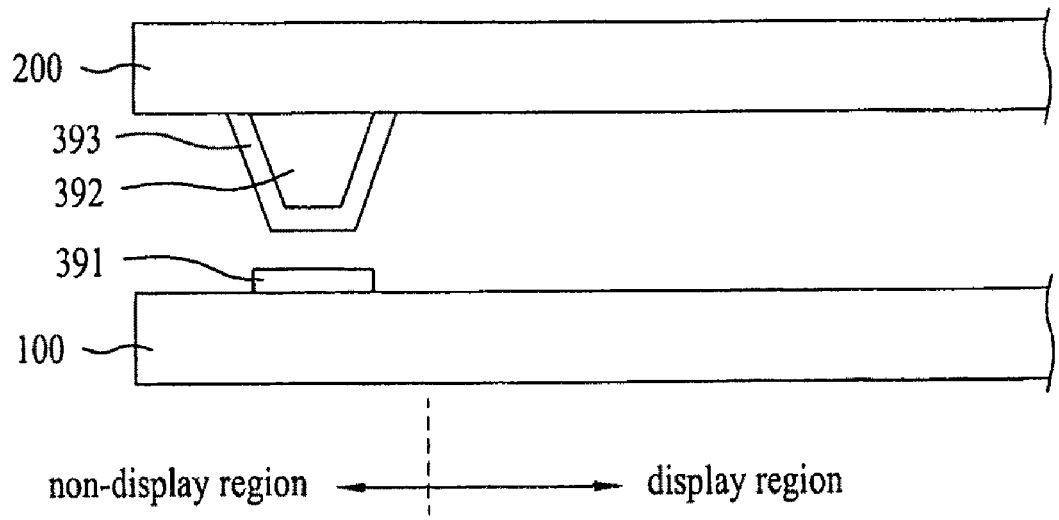
FIGS. 13A and 13B are process sectional views illustrating a first sealing method of the organic light emitting display device according to the fourth embodiment of the present invention.
Figure 13B:
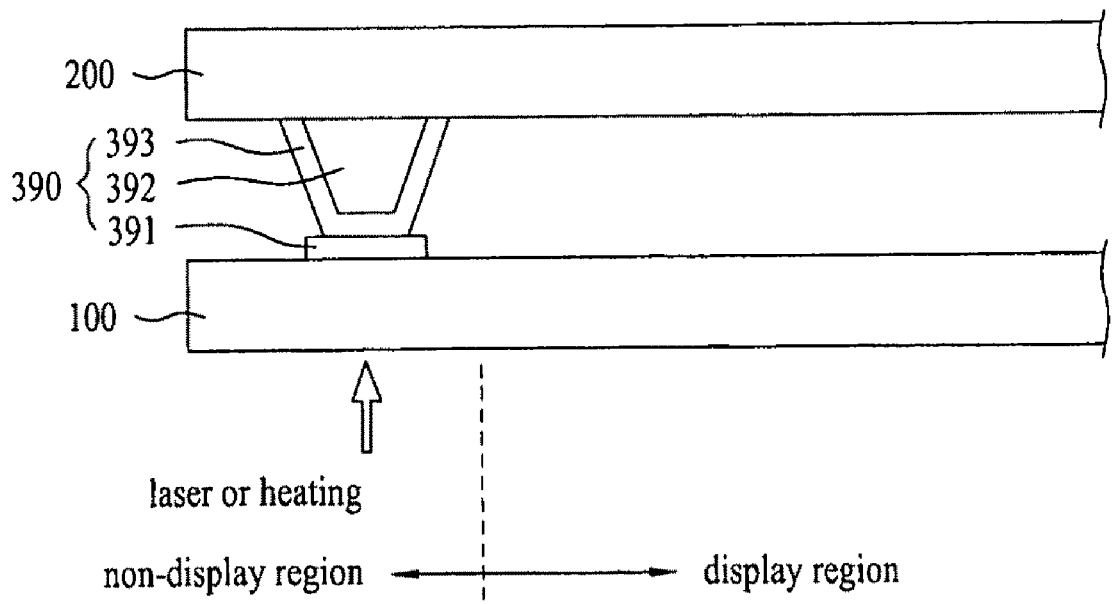

FIGS. 13A and 13B are process sectional views illustrating a first sealing method of the organic light emitting display device according to the fourth embodiment of the present invention.

As shown in FIG. 13A, a first substrate 100, having a TFT array and a first electrode pattern 391 formed thereon, and a second substrate 200, having an organic filler 392 and a second electrode pattern 393 covering the organic filler 392 as well as first and second electrodes (not shown) and an organic light emitting layer (not shown) formed thereon, are arranged such that the first substrate 100 and the second substrate 200 are opposite to each other.

As shown in FIG. 13B, the opposite first and second substrates 100 and 200 are attached to each other such that the first electrode pattern 391 of the first substrate 100 comes into contact with the second electrode pattern 393 of the second substrate 200, and then heat is applied or laser is irradiated to the rear surface of the first substrate 100 to melt the first electrode pattern 391 such that the first electrode pattern 391 is joined to the second electrode pattern 393 by thermal interdiffusion between the first electrode pattern 391 and the second electrode pattern 393.

For the laser irradiation, laser may be irradiated to either the rear surface of the first substrate 100 or the rear surface of the second substrate 200. For the heat treatment, it is preferred to apply heat to the first substrate 100. The reason why the heat is selectively applied to the first substrate 100 where the first electrode pattern 391 is formed is that the degradation of the organic light emitting layer formed on the second substrate 200 due to the heat is minimized.

In this case, it is preferred to make the first electrode pattern 391 and the second electrode pattern 393, which are melted by laser irradiation or heat treatment, of a low melting point metal material having a melting point of approximately 100 to 300° C. as previously described. In particular, when the heat treatment is selectively carried out to only the first substrate 100, it is required to make the first electrode pattern 391 of a low melting point metal material.

Figure 14A:
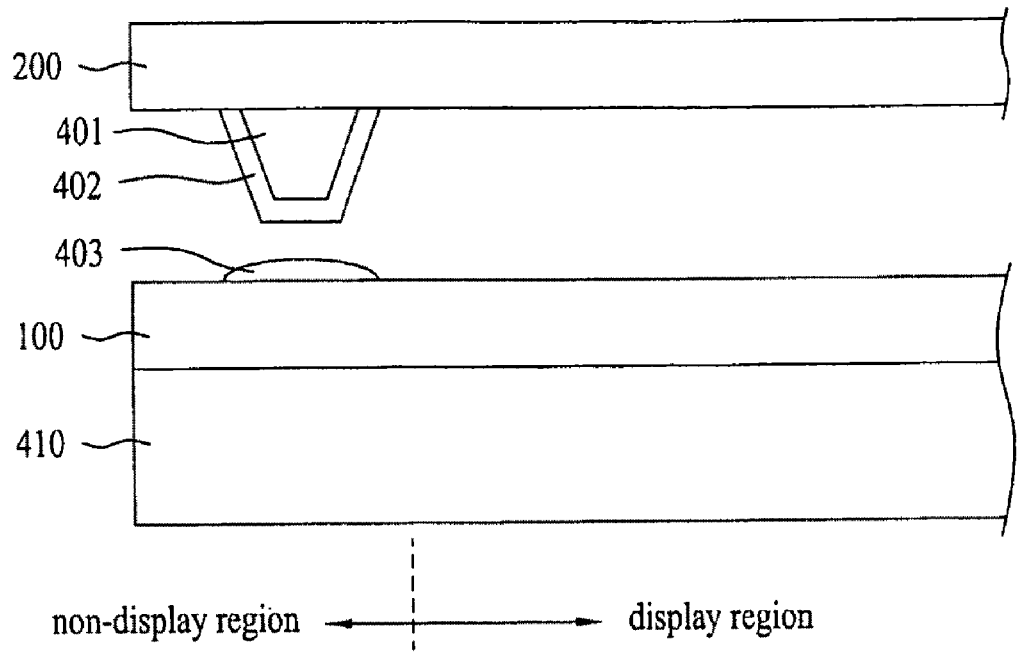
FIGS. 14A and 14B are process sectional views illustrating a second sealing method of the organic light emitting display device according to the fourth embodiment of the present invention.
Figure 14B:
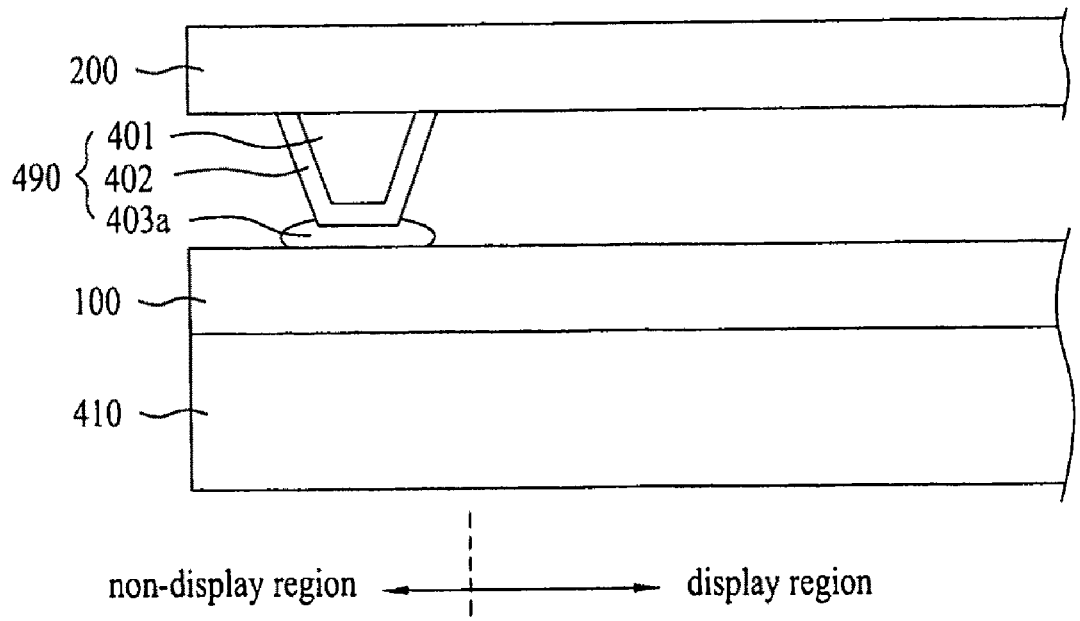

FIGS. 14A and 14B are process sectional views illustrating a second sealing method of the organic light emitting display device according to the fourth embodiment of the present invention.

As shown in FIG. 14A, a first substrate 100, having a first electrode pattern 403 partially formed at a non-display region thereon, is mounted on a hot plate 410, and the hot plate 410 is heated to a temperature of approximately 100 to 300° C. to melt the first electrode pattern 403 on the first substrate 100. After that, an organic filler 401 and a second electrode pattern 402 covering the organic filler 401 are formed such that the organic filler 401 and the second electrode pattern 402 correspond to the first electrode pattern 403.

Subsequently, as shown in FIG. 14B, the first electrode pattern 403, which has been melted by the hot plate 410 before the attachment, is brought into contact with the second electrode pattern 402 deposited on the organic filler 401, and a welding process between the first electrode pattern 403 and the second electrode pattern 402 is carried out.

After the welding process is completed, the first electrode pattern 403a is solidified, while the first electrode pattern 403a is welded to the second electrode pattern 403, by removing the hot plate 410 or reducing the temperature of the hot plate 410.

The organic light emitting display device according to the fourth embodiment of the present invention may further include a seal pattern, made of an ultraviolet curing type organic material, disposed outside or inside the seal unit at the non-display region, as in the previous second and third embodiments of the present invention. Such a double seal structure prevents external air or moisture from being introduced into the organic light emitting display device, thereby improving the reliability of the organic light emitting display device.

Figure 15A:
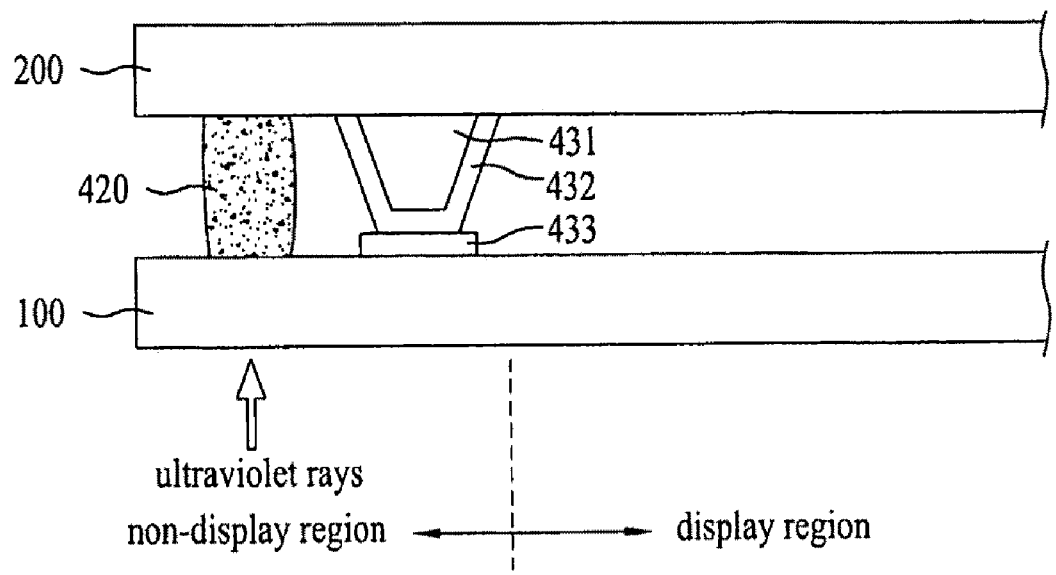
FIGS. 15A and 15B are process sectional views illustrating a sealing method of an organic light emitting display device according to a modification of the fourth embodiment of the present invention.
Figure 15B:
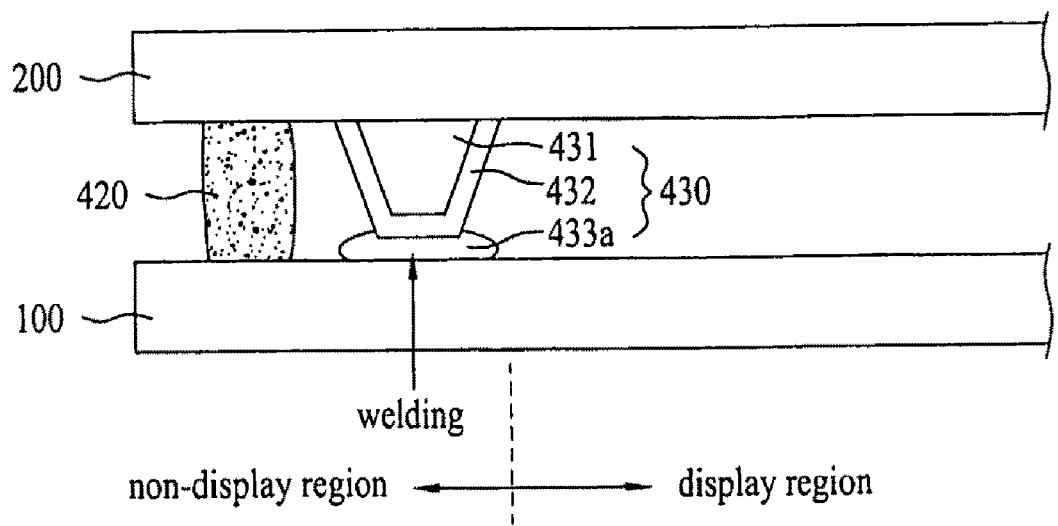

FIGS. 15A and 15B are process sectional views illustrating a sealing method of an organic light emitting display device according to a modification of the fourth embodiment of the present invention.

FIG. 15A illustrates an example in which an ultraviolet curing type organic seal pattern 420 is formed outside a seal unit 430 when the seal unit 430 is constructed by laser irradiation after the attachment of the first and second substrates 100 and 200, and FIG. 15B illustrates an example in which an ultraviolet curing type organic seal pattern 420 is formed outside a seal unit 430 when the seal unit 430 is constructed while a first electrode pattern 433a is melted by heat treatment.

Here, the ultraviolet curing type organic seal pattern 420 may be formed at the non-display region on the first substrate 100 where a TFT array (not shown) is formed or at the non-display region on the second substrate 200 where an organic light emitting layer (not shown) is formed and first and second electrodes (not shown) are formed above and below the organic light emitting layer. Preferably, the ultraviolet curing type organic seal pattern 420 is formed on the second substrate 200, which has no steps.

Figure 16A:
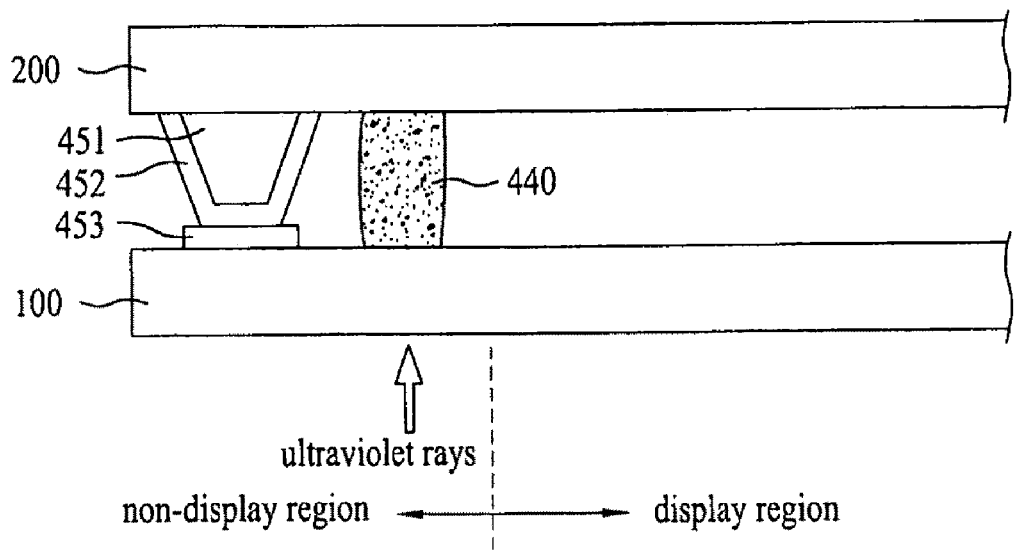
FIGS. 16A and 16B are process sectional views illustrating a sealing method of an organic light emitting display device according to a fifth embodiment of the present invention.
Figure 16B:
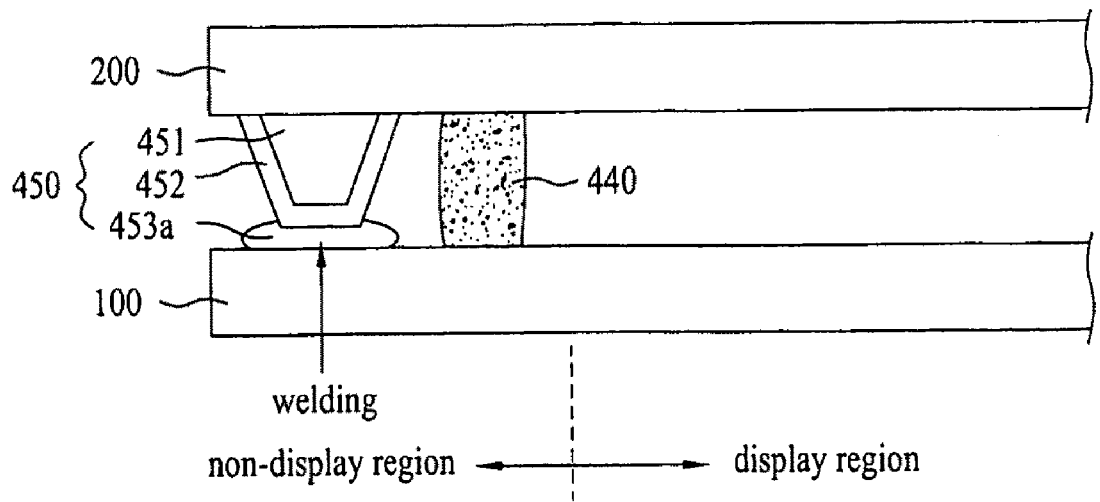

FIGS. 16A and 16B are process sectional views illustrating a sealing method of an organic light emitting display device according to a fifth embodiment of the present invention.

According to circumstances, the positional relationship between the seal pattern 420 and the seal unit 430 including metal components as shown in FIG. 15B may be changed such that, as shown in FIG. 16B, an ultraviolet curing type organic seal pattern 440 is formed outside a seal unit 450, including an organic filler 451 formed on the second substrate 200, a second electrode pattern 452 covering the organic filler 451, and a first electrode pattern 453 formed on the first substrate 100, such that the ultraviolet curing type organic seal pattern 440 is spaced apart from the seal unit 450.

In this case, as shown in FIGS. 16A and 16B, the organic seal pattern 440 may be cured by ultraviolet rays, the first electrode pattern 453a may be melted, and the welding process between the first and second electrode patterns 453a and 452 may be carried out. Alternatively, the sequence may be changed.

In this case, components constituting the seal unit 450 are formed at the time of forming TFT arrays on the first and second substrates 100 and 200 and forming organic partition walls or first and second electrodes. The organic seal pattern 440 is formed before arranging the first and second substrates 100 and 200 such that the first and second substrates 100 and 200 are opposite to each other after the formation of the arrays. In this case, the first and second electrode patterns 453 and 452, formed at the array forming process, are located in a floating state while the first and second electrode patterns 453 and 452 are spaced apart from a second electrode (or a first electrode) and a transparent electrode formed at the same layer.

Figure 17:
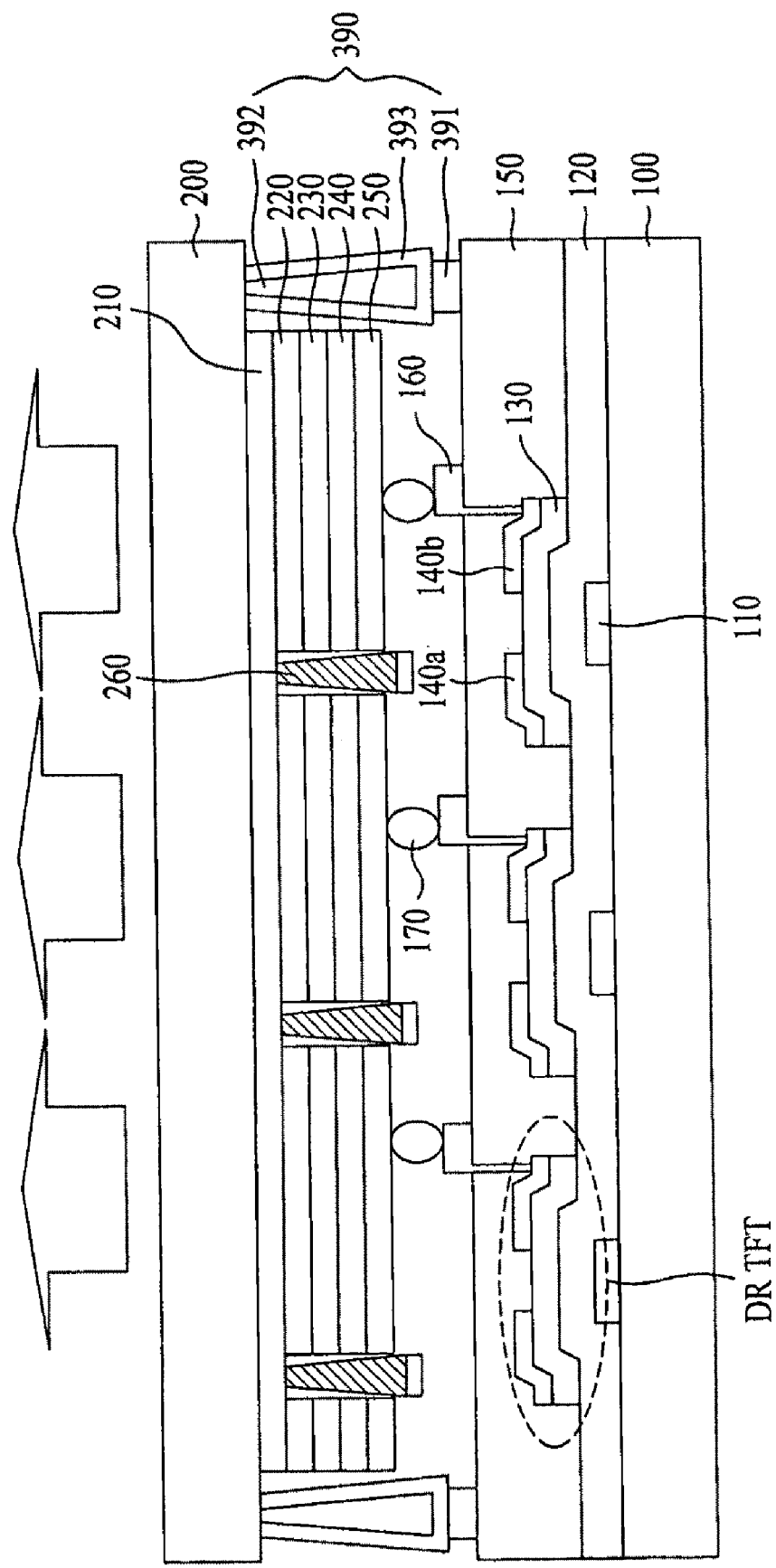
FIG. 17 is a sectional view concretely illustrating the internal construction of the organic light emitting display device according to the fourth embodiment of the present invention.

FIG. 17 is a sectional view concretely illustrating the internal construction of the organic light emitting display device according to the fourth embodiment of the present invention.

As shown in FIG. 17, a method of manufacturing the organic light emitting display device according to the fourth embodiment of the present invention is carried out as follows. First, a first substrate 100 having a display region defined in the middle thereof and a non-display region defined at the edge thereof and a second substrate 200 having a display region defined in the middle thereof and a non-display region defined at the edge thereof are prepared.

A TFT array is formed on a first substrate 100 (110S). A process for forming the TFT array was previously described with reference to FIG. 11.

Subsequently, a transparent electrode layer is formed on the entire surface of a protective film 150 including a contact hole, and the transparent electrode layer is selectively removed such that a transparent electrode 160 is formed at each pixel region and a first electrode pattern 391 is formed in the shape of a closed loop at the non-display region.

Subsequently, a conductive spacer 170 is formed at a predetermined area on the transparent electrode 160.

A process is carried out on the second substrate 200, opposite to the first substrate 100, in the following sequence. That is, a transparent conductive metal material, such as indium tin oxide (ITO), is deposited on the entire surface of the second substrate 200 corresponding to the display region to form a first electrode 210. According to circumstances, the first electrode 210 may be formed on the entire surface of the second substrate 200.

Subsequently, organic partition walls 260, made of an organic material, such as polyimide, and having a predetermined height are formed on the second substrate 200 corresponding to a gate line and a data line (above a bus line at the time of forming the bus line) at the display region. At the non-display region, an organic filler 392 is formed at a position corresponding to the first electrode pattern 391.

Subsequently, a first carrier transmission layer 220, an organic light emitting layer 230, and a second carrier transmission layer 240 are sequentially formed on the first electrode 210 located at each pixel region between the respective organic partition walls 260 using an evaporation equipment (140S). The organic light emitting layer 230 has any one selected from a group consisting of R, G, and B. The first and second carrier transmission layers 220 and 240 serve to inject and transmit hole and electron to the organic light emitting layer 230 between the first electrode 210 and a second electrode 250, which will be formed subsequently.

Subsequently, a metal layer, made of a metal material such as titanium (Ti), molybdenum (Mo), calcium (Ca), magnesium (Mg), barium (Ba), or aluminum (Al), is deposited on the entire surface of the second substrate 200, including the second carrier transmission layers 240 and the organic partition walls 260, to form second electrodes 250, which are cathode electrodes (145S). At this time, the second electrodes 250 are separated from each other between the respective pixel regions P. That is, the second electrodes 250 are separated from each other by the respective partition walls 260. The metal layer component, such as titanium (Ti), molybdenum (Mo), calcium (Ca), magnesium (Mg), barium (Ba), or aluminum (Al), may be left on the respective partition walls 260. At the time of forming the second electrodes 250, a second electrode pattern 393 covering the organic filler 392 is formed at the non-display region.

Subsequently, the first and second substrates 100 and 200 are attached to each other while the first and second substrates 100 and 200 are disposed opposite to each other (160S). At the time of attaching the first and second substrates 100 and 200, the second electrode pattern 393 is brought into contact with the first electrode pattern 391.

Subsequently, laser is irradiated to the rear surface of the first substrate 100 where the first electrode pattern 391 is located or the rear surface of the second substrate 200 where the second electrode pattern 393 is located, or heat is applied to the first electrode pattern 391 side, such that the first electrode pattern 391 and the second electrode pattern 393 are joined to each other by thermal inter-diffusion between the first electrode pattern 391 and the second electrode pattern 393. As a result, a seal unit 390 is formed by the joint between the first electrode pattern 391 and the second electrode pattern 393.

In the organic light emitting display device according to the fourth embodiment of the present invention, processes for forming the arrays including the metal oxide films are additionally carried out on the upper and lower substrates, the two substrates are attached to each other, and laser is irradiated to the two substrates to connect the metal oxide films to the connection electrode pattern.

The organic light emitting display device according to the fourth embodiment of the present invention is different from the organic light emitting display device according to the first embodiment of the present invention shown in FIG. 11 in that the first electrode pattern is formed in place of the first metal oxide film, and the organic filler 392 and the second electrode pattern 393 covering the organic filler 392 are formed at the non-display region in place of the second metal oxide film and the connection electrode pattern, in addition to the organic partition walls 260 formed at the display region.

Also, it can be seen from the illustrated drawing that the electrode pattern are further formed together with the second electrode 250 on each organic partition wall 260 formed at the display region. In the sequence of the process, each organic partition wall 260 is formed before the formation of the organic light emitting layers 220, 230, and 240, and the second electrode 250. The organic light emitting layers 220, 230, and 240 are formed between the respective organic partition walls 260. The second electrode is formed without a mask. Consequently, the second electrode is left in each organic partition wall 260. In this case, the electrode pattern on each organic partition wall is maintained in a floating state, and the electrode pattern has no functions.

Also, the method of manufacturing the organic light emitting display device according to the modification of the fourth embodiment and the fifth embodiment of the present invention is identical to the manufacturing method shown in FIG. 17 except that the seal pattern is further formed inside or outside the seal unit, and therefore, a detailed description thereof will not be given.

Hereinafter, the application of power supply voltage to the seal unit of the organic light emitting display device according to the present invention will be described in detail.

Figure 18:
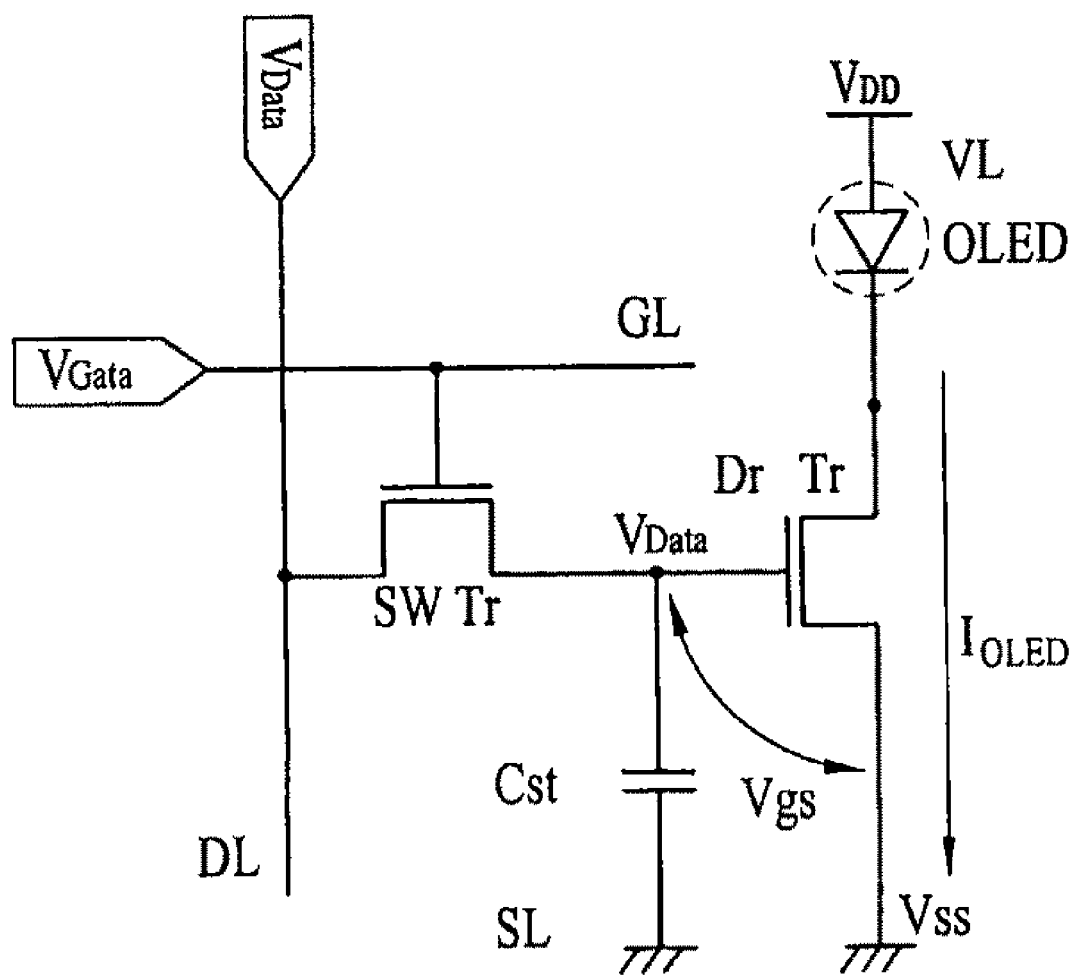
FIG. 18 is a circuit diagram illustrating a pixel of the organic light emitting display device according to the present invention.

FIG. 18 is a circuit diagram illustrating a pixel of the organic light emitting display device according to the present invention.

In the organic light emitting display device according to the present invention, as shown in FIG. 18, the seal unit, including the metal components as principal components, is formed in the shape of a closed loop to surround the first and second substrates. Also, the seal unit has a predetermined width. Consequently, the seal unit may be used as a power supply voltage (VDD) application line along which a large amount of electric current flows. In this case, the power supply voltage application line is connected to a power supply voltage application terminal of the pad part.

Referring to FIG. 11, the second metal oxide film 302 of the organic light emitting display device according to the first embodiment of the present invention is connected integrally to the first electrode 210 of the second substrate 200, and therefore, the second metal oxide film 302 has the same electrical potential as the first electrode 210. Here, the first electrode 210 may serve as an anode of an organic light emitting diode (OLED) of FIG. 18, and the second metal oxide film 302 may serve as a path to which the power supply voltage VDD is applied together with the first electrode pattern 301 through the connection electrode pattern 305.

Referring to a circuit of FIG. 18, a gate line GL connected to a gate terminal Vgate is formed in the first direction. A data line DL, connected to a data terminal Vdata, and a power supply voltage line VL, connected to a power supply voltage application terminal VDD, are formed in the second direction intersecting the first direction. The data line DL and the power supply voltage line VL are spaced a predetermined distance from each other. The gate line GL, the data line DL, and the power supply voltage line VL define a pixel region.

Also, a switching thin film transistor SW TR, which is an addressing element, is formed at the intersection between the gate line GL and the data line DL. A storage capacitor CST is connected to the switching thin film transistor SW TR and a ground line SL. A driver thin film transistor DR TR, which is a current source element, is connected to the storage capacitor CST and the power supply voltage line VL. An organic light emitting diode (OLED) is formed on the power supply voltage line VL such that the organic light emitting diode (OLED) is connected to the driver thin film transistor DR TR.

Here, the thin film transistor of FIG. 11 corresponds to the driver thin film transistor of FIG. 18.

When electric current is supplied to an organic light emitting material of the organic light emitting diode (OLED) of FIG. 18 in the forward direction, electrons and holes move through a P (positive)-N (negative) junction between an anode electrode, which is a hole providing layer, and a cathode electrode, which is an electron providing layer, with the result that the electrons and holes are recombined to each other. The organic light emitting diode (OLED) has a smaller energy than when the electrons and the holes are spaced apart from each other. Consequently, the organic light emitting diode (OLED) emits light due to such energy difference. The organic light emitting diode includes the organic light emitting layer 230 formed on the second substrate 200 of FIG. 11 and the first electrode 210 and the second electrode 250 located above and below the organic light emitting layer 230. Here, the power supply voltage application terminal (not shown) formed at the pad part is electrically connected to the seal unit 300 including the first metal oxide film 302.

The organic light emitting display device according to the present invention is not limited to the above-described dual plate type organic light emitting display device. The organic light emitting display device according to the present invention may be applied in an encapsulation type structure, which is a kind of lower light emitting type structure. In the lower light emitting type structure, the above-described structure and manufacturing method may be applied except that the organic light emitting layer is formed on the second substrate and the first and second electrodes are formed on the first substrate.

Hereinafter, an organic light emitting display device according to the present invention will be described in detail with the accompanying drawings.

FIGS. 19A to 19E are sectional views illustrating a process for manufacturing an organic light emitting display device according to a sixth embodiment of the present invention.

As shown in FIG. 19A, a metal film is formed on a first substrate 100, and then a gate electrode 201, a power supply wire 411, and a first dummy pattern 413 are formed on the metal film. At this time, a dual metal film made of AlNd or AlNd and Mo may be used as the metal film.

Subsequently, a gate insulation film 102 is formed on the entire surface of the first substrate 100, and then an amorphous silicon film, a doped amorphous silicon film, and a metal film are formed on the entire surface of the first substrate 100. Subsequently, etching is carried out according to a diffraction mask process or a half tone mask process to simultaneously form source/drain electrodes 203a and 203b, an active layer 202 including an ohmic contact layer and a channel layer, and a data wire (not shown). Mo or an alloy thereof or Cu or an alloy thereof may be used as the metal film.

At this time, second and third dummy patterns 413b and 413c, constituted by an active layer and a source/drain metal layer, are formed on the top of the first dummy pattern 413a. Also, a mask process for forming the active layer 202 and a mask process for forming the source/drain electrodes 203a and 203b may be carried out without using the diffraction mask or the half tone mask.

Figure 19B:
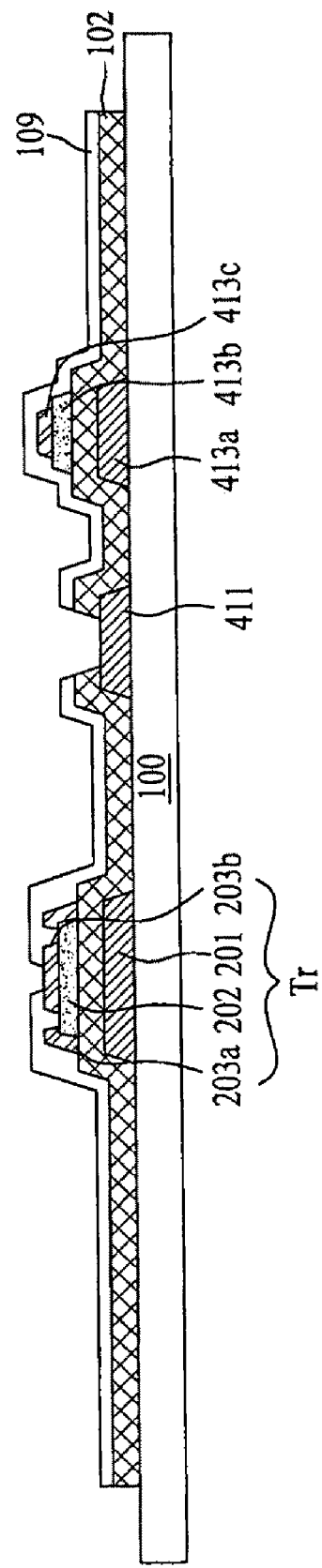

After a thin film transistor Tr, including the gate electrode 201, active layer 202, and the source/drain electrodes 203a and 203b, is formed, as shown in FIG. 19B, a protective film 109 is formed on the entire surface of the first substrate 100, and then a contact hole process is carried out using photolithography including a mask to expose a portion of the drain electrode 203b and to expose a portion of the power supply wire 411. Although not shown in the drawing, a gate pad region and a data pad region are also etched to expose a portion of a gate pad and to expose a portion of a data pad.

Figure 19C:
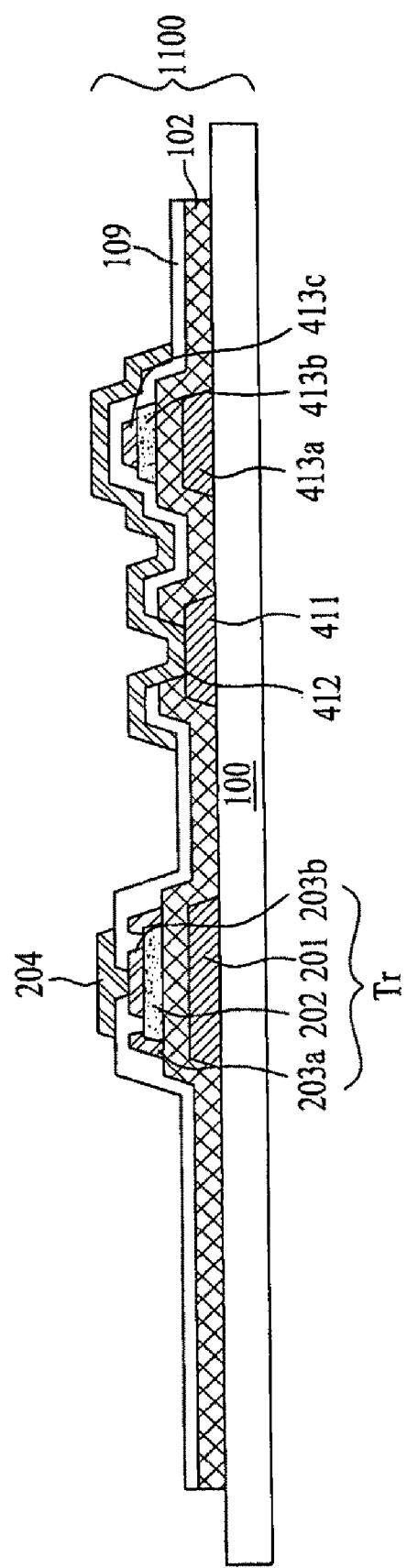

After the contact hole process on the protective film 109 is completed, as shown in FIG. 19C, a metal film is formed on the first substrate 100, and the metal film is patterned to form a contact part 204 electrically contacting the drain electrode 203b and a power supply electrode 412 electrically contacting the power supply wire 411.

Figure 19D:
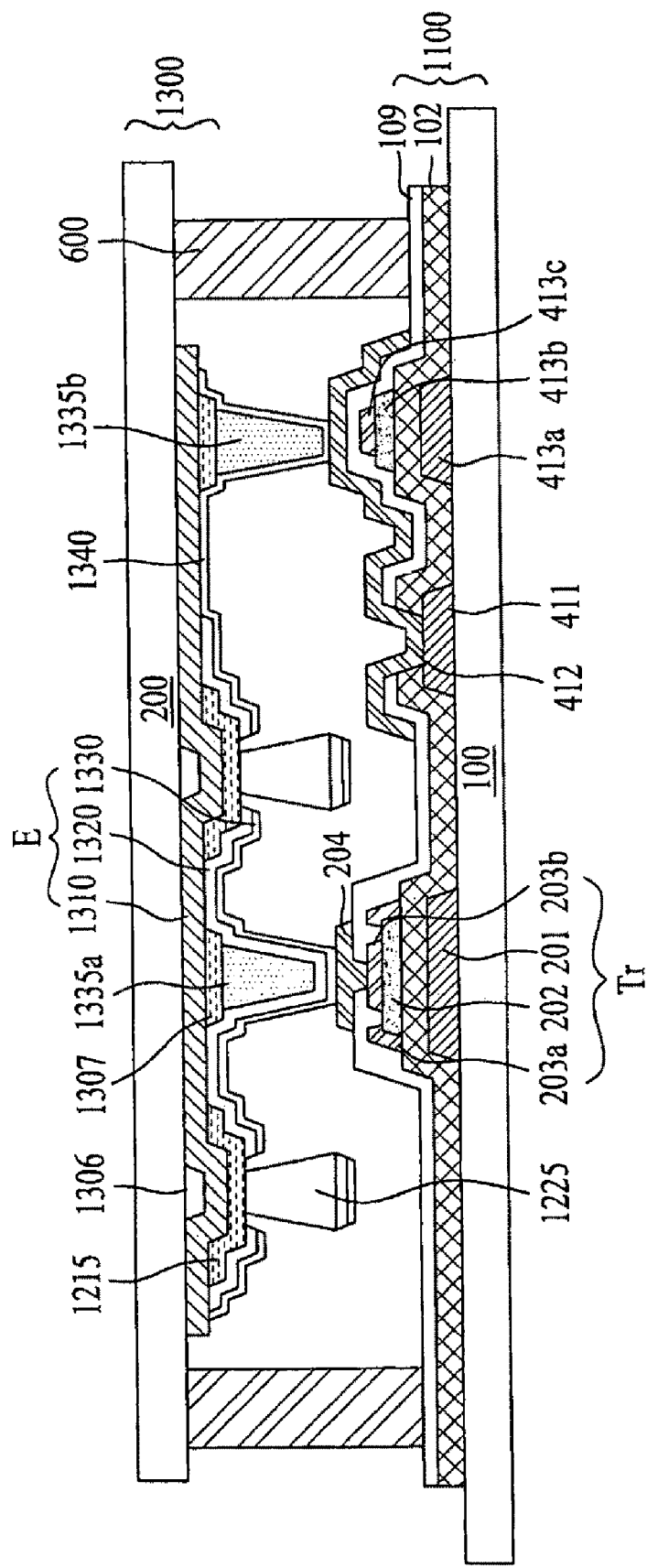

After a lower substrate 1100 of the organic light emitting display device is completed through the above-described process, as shown in FIG. 19D, a process for attaching the lower substrate 1100 to an upper substrate 1300 including an organic electroluminescence layer such that the lower substrate 1100 corresponds to the upper substrate 1300 is carried out.

The upper substrate 1300 includes a bus line 306 (an auxiliary electrode), of a conductive metal pattern, formed in the second substrate 200. A first electrode 1310 is formed on the second substrate 200 on which the bus line 306 is formed.

A sub-pixel region is partitioned by a first buffer layer 1215 and a partition wall 1225, formed on the first buffer layer 1215, on the second substrate 200 on which the first electrode 1310 is formed. Also, a second buffer layer 1307 and first and second column spacers 1335a and 1335b are formed to achieve the electrical contact between the electrode of the upper plate 1300 and the thin film transistor Tr of the lower substrate 1100. The first and second column spacers 1335a and 1335b are formed on the second buffer layer 1307.

Also, an organic electroluminescence layer 1320 and a second electrode 1330 are formed on the first electrode 1310 at the sub-pixel region. Consequently, the first electrode 1310, the organic electroluminescence layer 1320, and the second electrode 1330 at the sub-pixel region constitute an organic electroluminescence diode E.

The organic electroluminescence layer 1320 may be constructed such that red. (R), green (G), and blue (B) organic electroluminescence layers are individually formed for each sub-pixel, or R, G, and B organic electroluminescence layers are stacked to generate white light for each sub-pixel. In the structure in which the R, G, and B organic electroluminescence layers are stacked to generate white light, R, G, and B color filters may be further formed on the lower substrate or the upper substrate for each sub-pixel. Also, the organic electroluminescence layer may be constituted by a single white organic electroluminescence layer. Even in this case, R, G, and B color filters may be further formed on the lower substrate 1100 or the upper substrate 1300 for each sub-pixel. Based on the color filters formed on the lower substrate 1100 or the upper substrate 1300, the organic light emitting display device is driven in a lower light emitting type structure or an upper light emitting type structure.

A contact electrode 1340 formed on the second column spacer 1335b and the first electrode 1310 are in electrical contact with the power supply wire 411 of the lower substrate 1100, to which power supply voltage is applied, and the power supply electrode 412. Consequently, power supply voltage is applied from the lower substrate 1100 to the upper substrate 1300. At this time, the contact electrode 1340 is patterned simultaneously with the formation of the second electrode 1330.

After the upper substrate 1300 and the lower substrate 1100 are completed, a sealant is applied to the upper substrate 1300 or the lower substrate 1100, the upper substrate 1300 and the lower substrate 1100 are attached to each other, and ultraviolet rays UV are irradiated to the attached the upper and lower substrates 1300 and 1100 (a sealant curing process) to form a seal line 600. The seal line 600 may be made of a thermosetting material, such as a frit sealant.

Figure 19E:
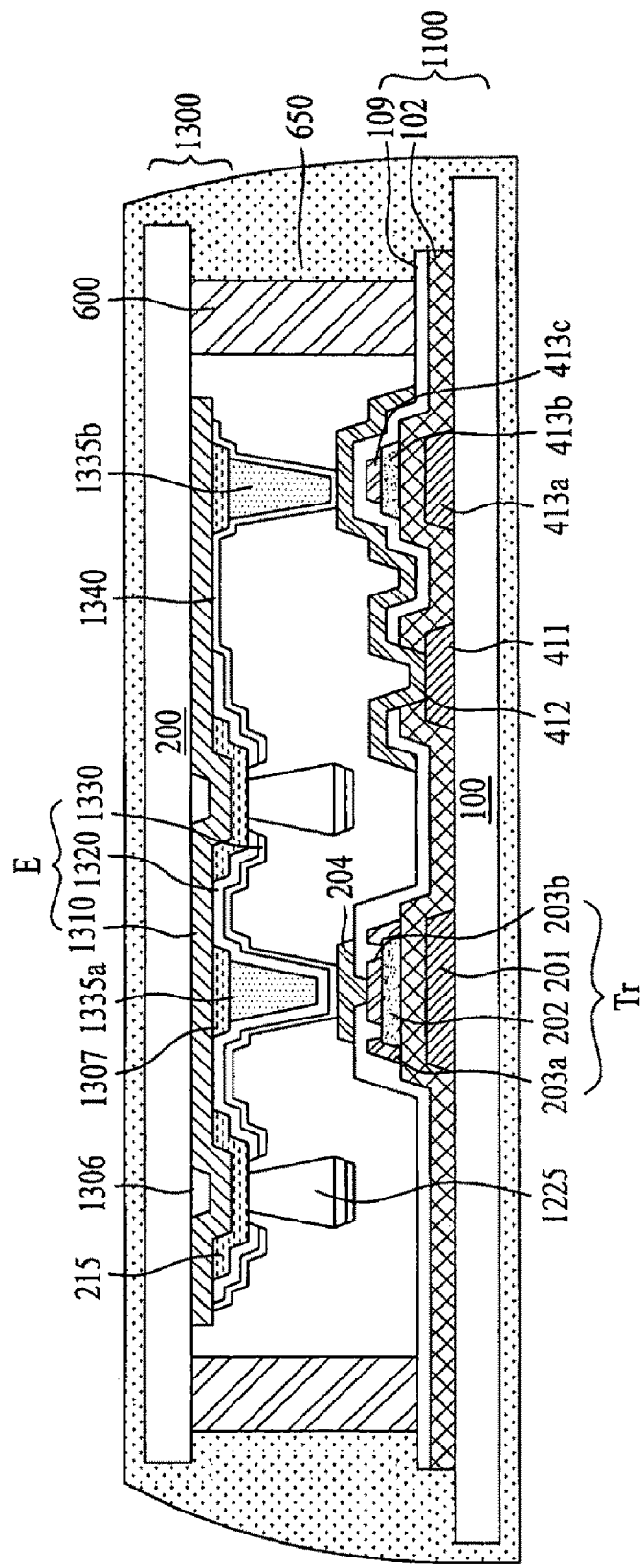

After the upper substrate 1300 and the lower substrate 1100 are bonded to each other via the seal line 600, as shown in FIG. 19E, a capsule film 650 is formed throughout the bonded substrates using a transparent sealant solution. As a result, the outer front and rear surfaces and the side surfaces of the bonded substrates are coated with the capsule film 650. The front surface of the bonded substrates is the outer surface of the upper substrate 1300, the rear surface of the bonded substrates is the outer surface of the lower substrate 1100, and the side surfaces of the bonded substrates are the circumferential surfaces of the bonded substrates. This definition will be applied in the same way in the following description. The capsule film 650 may be formed using a forming method of FIGS. 21 to 23.

The upper substrate 1300 and the lower substrate 1100 are manufactured such that the upper substrate 1300 and the lower substrate 1100 have different widths, and therefore, the capsule film 650 is formed, such that the capsule film 650 has a large thickness, at the edge region of the bonded substrates, whereby encapsulation efficiency is further improved.

The capsule film 650 is a fluorine resin based sealant. The capsule film 650 is made of a material that is curable at low temperature and exhibits high adhesion with glass. The fluorine resin based material includes amorphous fluoropolymer or fluorothermoplastic, which is used in a solution state. The above-specified materials have a transmissivity of 95% or more, and the above-specified materials are curable at a temperature of approximately 100° C. Consequently, it is possible to form the capsule film 650 at low temperature. As a result, the capsule film 650 does not affect the devices in the bonded substrates.

Since the capsule film 650 exhibits hydrophobicity, the capsule film 650 effectively prevents permeation of moisture or oxygen, thereby improving hermetic sealing of the organic light emitting display device.

Also, since the capsule film 650 is applied to the entire region of the bonded substrates, microcavity and low-reflection characteristics are realized, and therefore, the improvement of image quality is achieved. Furthermore, the capsule film 650 surrounds the entire surfaces of the bonded substrates, and therefore, it is possible to prevent the damage to devices due to vibration or external impact.

Figure 20:
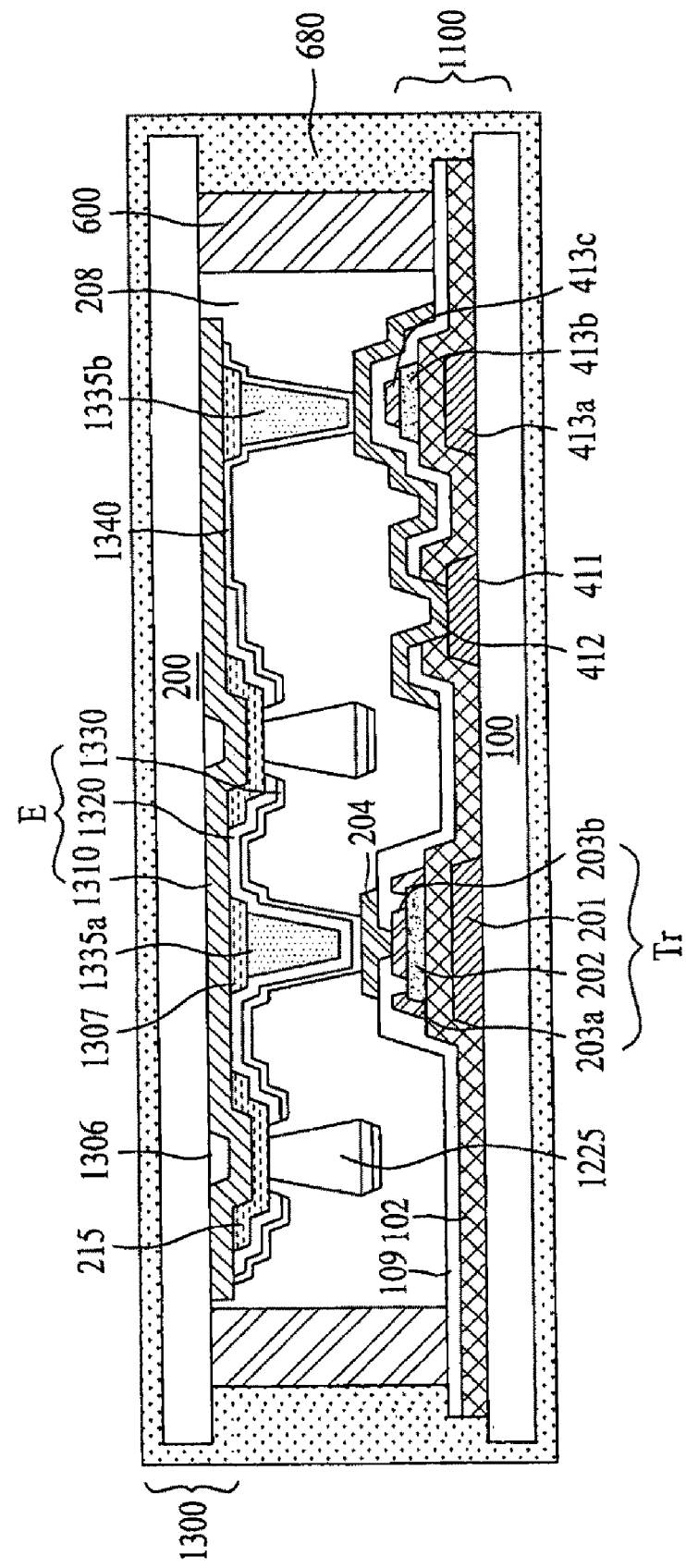
FIG. 20 is a sectional view illustrating the structure of an organic light emitting display device according to a seventh embodiment of the present invention.

FIG. 20 is a sectional view illustrating the structure of an organic light emitting display device according to a seventh embodiment of the present invention. Substrates of FIG. 20 have the same structure as the upper substrate and the lower substrate of FIG. 19E. Consequently, components of the organic light emitting display device according to the seventh embodiment identical to those of the organic light emitting display device according to the sixth embodiment are denoted by the same reference numerals, and a detailed description thereof will not be given.

As shown in FIG. 20, a second substrate 200 of an upper substrate 1300 and a first substrate 100 of a lower substrate 1100 are formed such that the second substrate 200 and the first substrate 100 have the same width. A capsule film 680 is formed at the entire regions of the upper substrate 1300 and the lower substrate 1100, which are bonded to each other. In this way, the present invention may be applied to the above structure in which the size of the panel of the organic light emitting display device or the width of the upper substrate 1300 is different from the width of the lower substrate 1100.

As shown in FIGS. 19E and 20, the organic electroluminescence layer 1320 is formed on the upper substrate 1300, and the TFT is formed on the lower substrate 1100. However, the present invention may be applied equally to an upper light emitting type organic light emitting display device in which both the TFT and the organic electroluminescence layer are formed on the upper substrate 1300 or a lower light emitting type organic light emitting display device in which both the TFT and the organic electroluminescence layer are formed on the lower substrate 1100.

That is, the seal line is primarily formed to bond the substrates, and the capsule film is formed to surround the entire surface of the bonded substrates, whereby hermetic sealing of the organic light emitting display device is improved.

Figure 21:
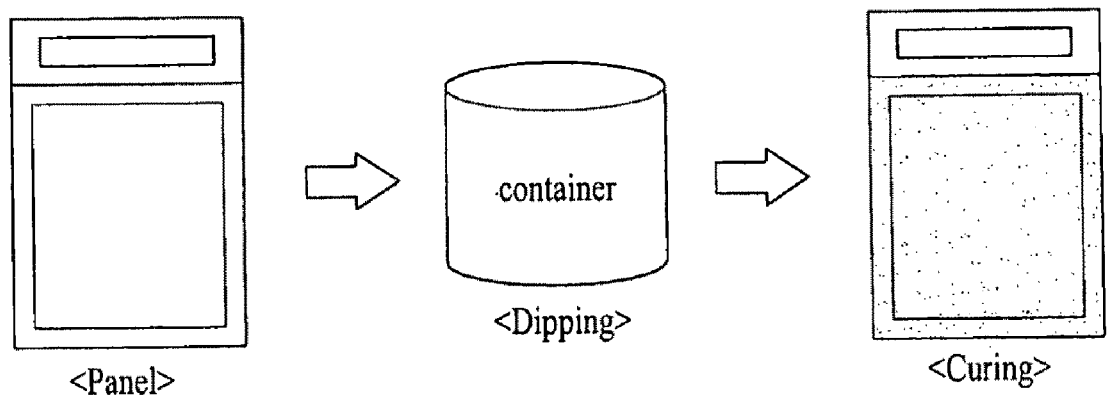
FIGS. 21 to 23 are views illustrating methods of forming a capsule film of the organic light emitting display device according to the present invention.
Figure 22:
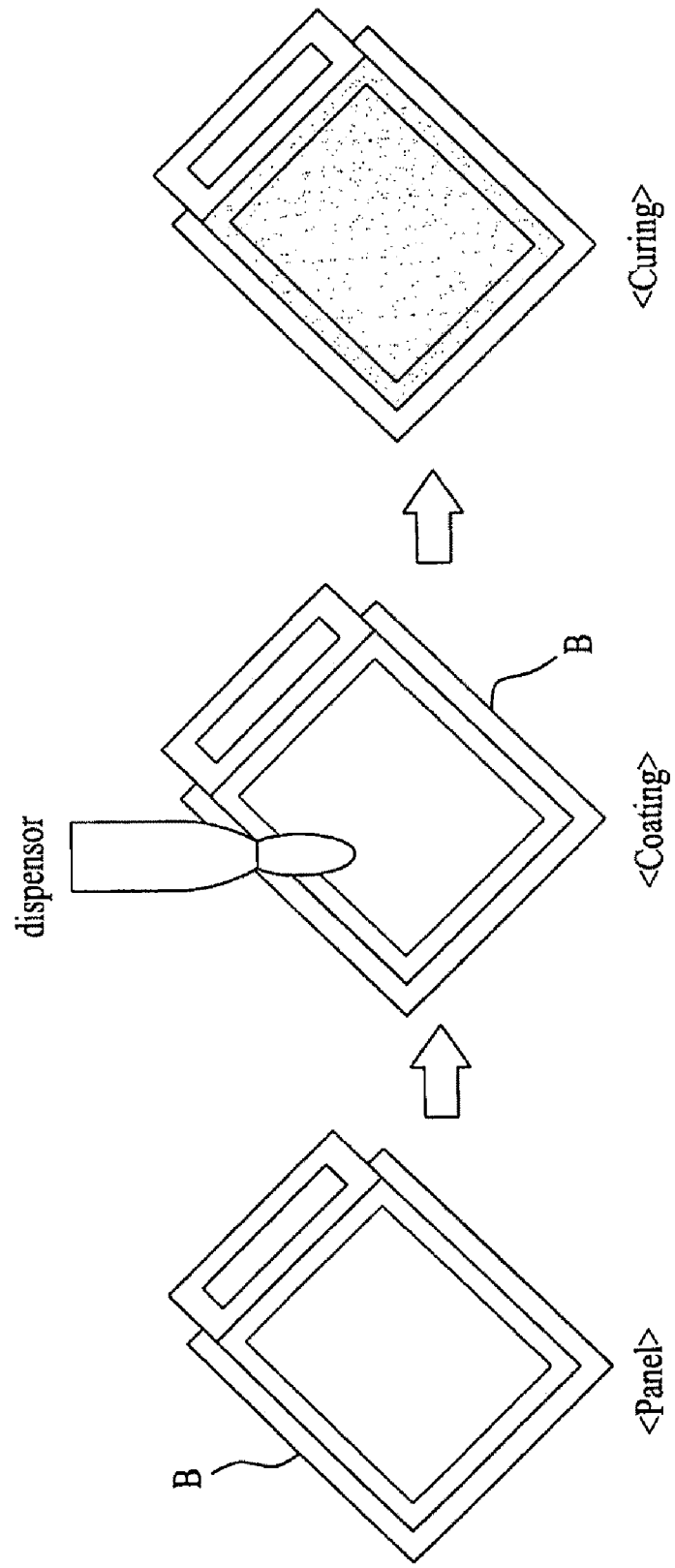
Figure 23:
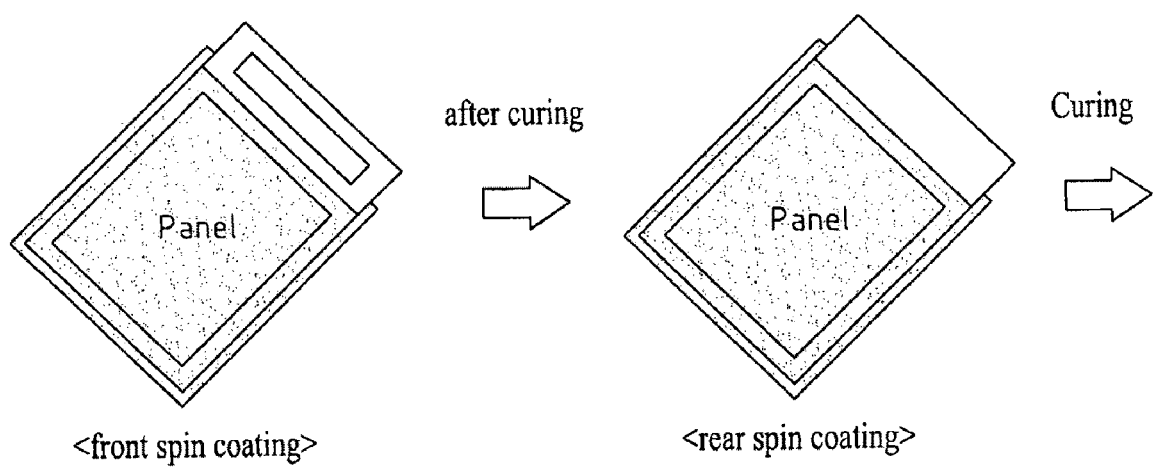

FIGS. 21 to 23 are views illustrating methods of forming the capsule film of the organic light emitting display device according to the present invention.

FIGS. 21 to 23 illustrate a process for forming the capsule film formed on the entire surface of the bonded substrates of the organic light emitting display device. Specifically, FIG. 21 illustrates a process for dipping an organic electroluminescence panel in a sealant solution to form a capsule film, FIG. 22 illustrates a process for coating the entire surface of an organic electroluminescence panel with a sealant by a dispensing or printing method to form a capsule film, and FIG. 22 illustrates a process for coating an organic electroluminescence panel by a spin coating method to form a capsule film.

Referring to FIG. 21, an organic electroluminescence panel, constituted by substrates bonded to each other by a seal line, is dipped in a sealant solution to form a capsule film on the entire region of the organic electroluminescence panel. Subsequently, a low-temperature curing process (approximately 100° C.) is carried out to cure the capsule film.

Referring to FIG. 22, substrates are bonded to each other after a seal line is formed on one of the substrates, and then an organic electroluminescence panel, constituted by the bonded substrates, is located on a base B. After that, a sealant is dispensed to the entire region of the organic electroluminescence panel using an instrument, such as a dispenser. A capsule film is formed at the front surface, the rear surface, and side surface of the organic electroluminescence panel. Subsequently, a low-temperature curing process is carried out to cure the capsule film. However, the capsule film may be formed by an inkjet method or a printing method.

Referring to FIG. 23, a nozzle for spraying a sealant is disposed above an organic electroluminescence panel, constituted by bonded substrates, and a liquid sealant is sprayed to the front surface of the organic electroluminescence panel from the nozzle, to form a capsule film on the front surface of the organic electroluminescence panel. After that, the organic electroluminescence panel is rotated such that the nozzle is opposite to the rear surface of the organic electroluminescence panel, and then the above process is carried out to form a capsule film on the rear surface of the organic electroluminescence panel. Subsequently, a low-temperature curing process is carried out to cure the capsule film.

Figure 24:
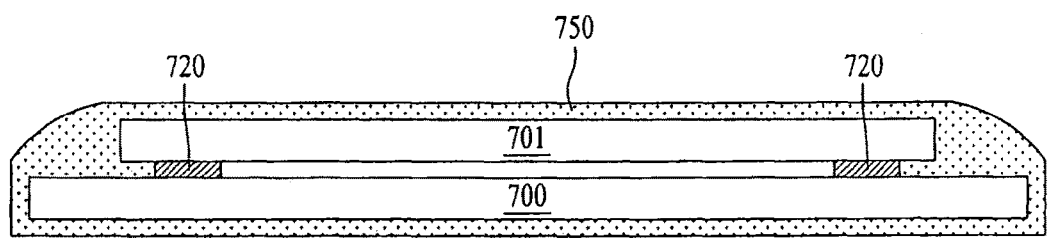
FIG. 24 is a sectional view illustrating the structure of an organic light emitting display device according to an eighth embodiment of the present invention.

FIG. 24 is a sectional view illustrating the structure of an organic light emitting display device according to an eighth embodiment of the present invention.

Referring to FIG. 24, an upper substrate 701 may have the same components as those formed on the upper substrate 1300 of FIGS. 19A to 19E, and a lower substrate 700 may have the same components as those formed on the lower substrate 1100 of FIGS. 19A to 19E. Also, a TFT and an organic electroluminescence layer may be formed on the lower substrate 700. Also, the upper substrate 701 and the lower substrate 700, which are bonded to each other, may substantially have the same structure as the upper light emitting type organic light emitting display device or the lower light emitting type organic light emitting display device.

Also, the upper substrate 701 may be a color filter substrate, and the lower substrate 700 may be an array substrate having a thin film transistor and a pixel electrode formed thereon, i.e., a liquid crystal display device. In addition, a liquid crystal layer may be disposed between the upper substrate 701 and the lower substrate 700.

The upper substrate 701 and the lower substrate 700 are bonded to each other by a seal line.720. The seal line may be made of a UV seal curing material, a thermosetting seal material (a $V_2O_5$, PbO, $B_2O_3$—ZnO, or $SiO_2$ based material), or a metal seal material. The upper substrate 701 and the lower substrate 700 may have different widths or the same width. A capsule film 750 is formed at front and rear surfaces and four side surfaces of the bonded substrates, and therefore, the capsule film 750 is located adjacent to the seal line 720 (see FIG. 20).

As shown in FIG. 24, the capsule film 750 is formed at the front surface of the substrates bonded to each other by the seal line 720. The capsule film 750 may be made of a transparent epoxy resin or a transparent silicon material.

Meanwhile, the capsule film 750 may be formed by the process previously described with reference to FIGS. 21 to 23.

Figure 25:
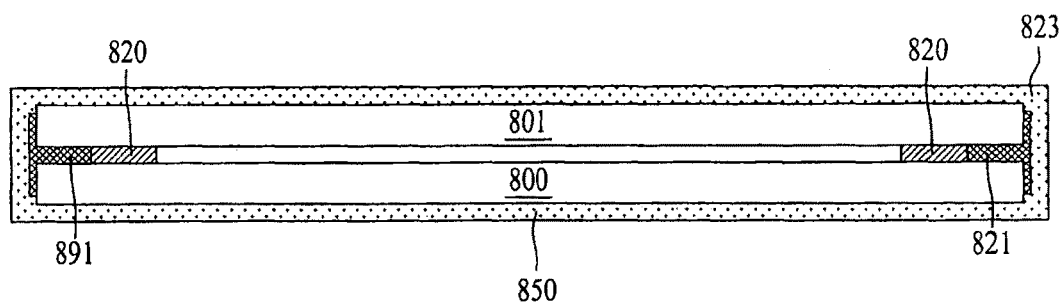
FIG. 25 is a sectional view illustrating the structure of an organic light emitting display device according to a ninth embodiment of the present invention.

FIG. 25 is a sectional view illustrating the structure of an organic light emitting display device according to a ninth embodiment of the present invention. As shown in FIG. 25, an upper substrate 801 and a lower substrate 800 are bonded to each other by a first seal line 820, a second seal line 821 is formed at the side surface of the bonded substrates, and a capsule film 823 is formed to cover the entire region of the bonded substrates.

The first seal line 820 may be made of an ultraviolet seal curing material, a thermosetting seal material, or a metal seal material. Also, the second seal line 821 may be made of an ultraviolet seal curing material, a thermosetting seal material, or a metal seal material. The first seal line 820 and the second seal line 821 may be made of different seal materials. For example, the first seal line 820 may be made of the ultraviolet seal curing material, and the second seal line 821 may be made of the thermosetting seal material or the metal seal material.

After the substrates are bonded to each other by the two seal lines, the capsule film 823 is formed to cover the entire region of the bonded substrates. The capsule film 823 is formed according to the process of FIGS. 21 to 23.

According to the present invention, therefore, the entire region of the bonded substrates is coated with the capsule film, which is made of a transparent material, whereby it is possible to protect the device from external moisture, vibration, and impact.

In the methods of manufacturing the organic light emitting display device according to the previous sixth to eighth embodiments of the present invention, the upper and lower substrates are bonded to each other by the seal line, and the entire surface of the bonded upper and lower substrates is surrounded by the capsule film, whereby the permeation of external moisture into the organic light emitting display device and the introduction of gas into the organic light emitting display device are effectively prevented.

Meanwhile, any one of the previous sixth to eighth embodiments may be combined with any one of the previous first to fifth embodiments. In other words, the material for the seal pattern may be changed, and the entire surface of the bonded upper and lower substrates, including the seal pattern, is surrounded by the capsule film to form the organic light emitting display device.

When it is described that the respective layers (films), the region, the pattern, or the structures are formed on/above/over/upper or down/below/under/lower the substrates, the respective layers (films), the region, the pad or the patterns in the above description, it may be interpreted that the respective layers (films), the region, the pad, the pattern, or the structures are formed such that the respective layers (films), the region, the pad, the pattern, or the structures are in direct contact with the substrates, the respective layers (films), the region, the pad or the patterns. Otherwise, it may be interpreted that other layers (films), other region, other pad, other pattern, or other structures are further formed therebetween. Accordingly, the meaning must be determined by the technical idea of the invention.

As apparent from the above description, the organic light emitting display device and the method of manufacturing the same according to the present invention has the following effects.

First, a low melting point metal material having a melting point of 100 to 300° C. is used in performing sealing between the upper and lower substrates. Consequently, the sealing between the upper and lower substrates is possible even at low temperature, whereby the damage to the organic light emitting layer is effectively prevented during the sealing process. The organic light emitting layer is weak to high temperature and toxic gases. In the method of manufacturing the organic light emitting display device according to the present invention, the sealing process is carried out at low temperature. Consequently, the damage to or the degradation of the organic light emitting layer is effectively prevented during the sealing process.

Second, when the sealing between the upper and lower substrates is carried out using only the conventional ultraviolet curing seal material, the seal material is easily separated from the surfaces of the substrates or inorganic films formed on the surfaces of the substrates due to the properties of the seal material, or external gas or moisture is easily permeated into the panel through the ultraviolet curing seal material. According to the present invention, the seal unit is made of a material including a metal component. Consequently, it is possible to prevent the seal unit from being separated from the substrates. Also, it is possible to prevent the degradation of pixels due to the permeation of gas or moisture.

Third, the frit seal may be used in place of the ultraviolet curing seal material. However, the frit seal is useful to seal a gap having approximately 10 μm or more due to the properties of a material for the frit seal (a glass-based material, a filler, or a basic material for coating). Consequently, when the gap between the upper and lower substrates is approximately 5 μm as in the dual plate type organic light emitting display device structure, it is substantially difficult to realize the frit seal with a small height sufficient to support the upper and lower substrates. Also, the edge of the frit seal easily cracks due to the properties of a material for the frit seal, and therefore, the frit seal may easily break. For this reason, the frit seal is difficult to use in a display device using glass as the substrates. In the organic light emitting display device according to the present invention, the seal material is made including a metal material overcoming the shortage of the ultraviolet curing seal material or the frit seal, and the upper and lower substrates are bonded to each other by the seal material including the metal material. The bonding between the metal materials is achieved by thermal inter-diffusion through heat treatment or laser irradiation, whereby the adhesion between the substrates is improved. Consequently, it is possible to prevent the permeation of external moisture, carbon dioxide, or other gases into the organic light emitting display device through the seal unit, thereby preventing the degradation of pixels due to external gases and eventually improving look-and-feel.

Fourth, the upper and lower substrates of the organic light emitting display device are bonded by the seal line, and the entire surface of the bonded upper and lower substrates is surrounded by the capsule film. Consequently, the present invention has the effect of preventing the permeation of external moisture into the organic light emitting display device and the introduction of gas into the organic light emitting display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
   a first substrate and a second substrate being opposite to each other, the first substrate and the second substrate having a display region defined in the middle thereof and a non-display region defined at the edge thereof, respectively;
   a plurality of gate lines and data lines formed at the display region on the first substrate, the gate lines and the data lines crossing each other to define a pixel region;
   a thin film transistor formed at each of the intersections between the gate lines and data lines;
   an organic light emitting layer formed on the second substrate corresponding to the pixel region, and first and second electrodes located above and below the organic light emitting layer; and
   a sealing structure connected between the first and second substrates, such that the first and second substrates are bonded to each other by the sealing structure, for preventing the permeation of moisture and gas,
   wherein the sealing structure includes:
      a first metal oxide film and a second metal oxide film formed on the first substrate and the second substrate, respectively, corresponding to the non-display regions between the first substrate and the second substrate in the shape of a closed loop, wherein the first metal oxide film and the second metal oxide film are opposite to each other, and
      a connection electrode pattern formed between the first metal oxide film and the second metal oxide film such that the connection electrode pattern contacts the first metal oxide film and the second metal oxide film.

2. The organic light emitting display device according to claim 1, wherein the sealing structure includes a capsule film formed to surround front, rear, and side surfaces of the opposite first and second substrates.

3. The organic light emitting display device according to claim 2, wherein the capsule film is a fluorine resin based sealant.

4. The organic light emitting display device according to claim 2, wherein the capsule film has a transmissivity of 95% or more.

5. The organic light emitting display device according to claim 1, wherein the connection electrode pattern has a melting point of 100 to 300° C.

6. The organic light emitting display device according to claim 5, wherein the connection electrode pattern is made of any one selected from a group consisting of In, Sn, Zn and Pb and an alloy thereof.

7. The organic light emitting display device according to claim 1, wherein the first and second metal oxide films are made of a metal oxide including at least one selected from a group consisting of In, Sn, Zn and Pb.

8. The organic light emitting display device according to claim 1, wherein the first electrode and the second metal oxide film are formed of one-body.

9. An organic light emitting display device comprising:
   a first substrate and a second substrate being opposite to each other, the first substrate and the second substrate having a display region defined in the middle thereof and a non-display region defined at the edge thereof, respectively;
   a plurality of gate lines and data lines formed at the display region on the first substrate, the gate lines and the data lines crossing each other to define a pixel region;
   a thin film transistor formed at each of the intersections between the gate lines and data lines;
   an organic light emitting layer formed on the second substrate corresponding to the pixel region, and first and second electrodes located above and below the organic light emitting layer; and
   a sealing structure connected between the first and second substrates, such that the first and second substrates are bonded to each other by the sealing structure, for preventing the permeation of moisture and gas,
   wherein the sealing structure includes:
      an organic filler formed on the second substrate corresponding to the non-display regions in the shape of a closed loop,
      a first electrode pattern on the first substrate corresponding to the organic filler, and
      a second electrode pattern formed at the non-display region on the second substrate, wherein the second electrode pattern contacts the first electrode pattern, for covering the organic filler.

10. The organic light emitting display device according to claim 9, wherein the first electrode pattern is made of a metal material having a melting point of 100 to 300° C.

11. The organic light emitting display device according to claim 9, further comprising:
    organic partition walls formed on the second substrate corresponding to the gate lines and the data lines, wherein
    the organic filler is formed on the same layer as the organic partition walls.

12. The organic light emitting display device according to claim 1, further comprising:
    a seal line formed at the non-display regions between the first substrate and the second substrate in the shape of a closed loop, wherein the seal line being made of an ultraviolet seal curing material, a thermosetting seal material, and a metal seal material.

13. A method of manufacturing an organic light emitting display device, comprising:
    preparing a first substrate and a second substrate being opposite to each other, the first substrate and the second substrate having a display region defined in the middle thereof and a non-display region defined at the edge thereof, respectively;

forming a plurality of gate lines and data lines crossing each other to define a pixel region at the display region on the first substrate;

forming a thin film transistor at each of the intersections between the gate lines and data lines;

forming an organic light emitting layer on the second substrate corresponding to the pixel region, wherein first and second electrodes located above and below the organic light emitting layer; and forming a sealing structure between the first and second substrates, at least at the side thereof, such that the first and second substrates are bonded to each other by the sealing structure, and, at the same time, the permeation of moisture and gas are prevented by the sealing structure, wherein the step of forming the sealing structure includes:
forming a transparent electrode at the pixel region and a first metal oxide film in the shape of a closed loop at the non-display region on the first substrate, respectively, forming a first electrode at the display region and a second metal oxide film in a shape corresponding to the first metal oxide film at the non-display region on the second substrate, respectively, forming an organic light emitting layer on the first electrode corresponding to the pixel region and a second electrode on the organic light emitting layer, forming a connection electrode pattern on the first metal oxide film, and joining the connection electrode pattern and the second metal oxide film to each other while arranging the first and second substrates such that the first and second substrates are opposite to each other.

14. The method according to claim 13, wherein the step of joining the connection electrode pattern and the second metal oxide film to each other is carried out by irradiating laser to the rear surface of the first substrate or the second substrate or by applying heat at a temperature of 100 to 300° C. using a hot plate.

15. A method of manufacturing an organic light emitting display device, comprising:
preparing a first substrate and a second substrate being opposite to each other, the first substrate and the second substrate having a display region defined in the middle thereof and a non-display region defined at the edge thereof, respectively;

forming a plurality of gate lines and data lines crossing each other to define a pixel region at the display region on the first substrate;

forming a thin film transistor at each of the intersections between the gate lines and data lines;

forming an organic light emitting layer on the second substrate corresponding to the pixel region, wherein first and second electrodes located above and below the organic light emitting layer; and forming a sealing structure between the first and second substrates, at least at the side thereof, such that the first and second substrates are bonded to each other by the sealing structure, and, at the same time, the permeation of moisture and gas are prevented by the sealing structure, forming organic partition walls formed on the first electrodes corresponding to the gate lines and the data lines, and forming an organic filler at the non-display region of the second substrate corresponding to the first electrode pattern, forming an organic light emitting layer on the second substrate corresponding to the pixel region on each organic partition wall, forming a second electrode pattern on the organic light emitting layer for covering the second electrode and the organic filler, and joining the first and second electrode patterns to each other while arranging the first and second substrates such that the first and second substrates are opposite to each other.

16. The method according to claim 15, wherein the step of joining the first and second electrode patterns to each other is carried out by applying heat to the first substrate including the first electrode pattern using a hot plate or by irradiating laser to the rear surface of the first or second substrate at the non-display region thereof.

* * * * *